(12) United States Patent
Yamazaki et al.

(10) Patent No.: US 11,355,176 B2
(45) Date of Patent: Jun. 7, 2022

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Kiyoshi Kato, Atsugi (JP); Hajime Kimura, Atsugi (JP); Atsushi Miyaguchi, Hadano (JP); Tatsunori Inoue, Isehara (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 17/048,330

(22) PCT Filed: Apr. 22, 2019

(86) PCT No.: PCT/IB2019/053299
§ 371 (c)(1),
(2) Date: Oct. 16, 2020

(87) PCT Pub. No.: WO2019/211697
PCT Pub. Date: Nov. 7, 2019

(65) Prior Publication Data
US 2021/0174857 A1 Jun. 10, 2021

(30) Foreign Application Priority Data
May 2, 2018 (JP) .............................. JP2018-088846

(51) Int. Cl.
*G11C 11/405* (2006.01)
*G06F 12/0893* (2016.01)
(Continued)

(52) U.S. Cl.
CPC ........ *G11C 11/405* (2013.01); *G06F 12/0893* (2013.01); *H01L 27/108* (2013.01); *H01L 27/1225* (2013.01)

(58) Field of Classification Search
CPC ........... G11C 11/405; G11C 5/14; G11C 7/04; G11C 11/4074; G06F 12/0893;
(Continued)

(56) References Cited

U.S. PATENT DOCUMENTS 8,541,846 B2 * 9/2013 Saito .................. H01L 27/1255
257/365
8,737,109 B2 5/2014 Yamazaki et al.
(Continued)

FOREIGN PATENT DOCUMENTS

CN 103081092 A 5/2013
JP 2012-069932 A 4/2012
(Continued)

OTHER PUBLICATIONS

International Search Report (Application No. PCT/IB2019/053299) dated Jul. 16, 2019.
(Continued)

*Primary Examiner* — Michael T Tran
(74) *Attorney, Agent, or Firm* — Robinson Intellectual Property Law Office; Eric J. Robinson

(57) ABSTRACT

A semiconductor device in which a memory region at each level of a memory device can be changed is provided. The semiconductor device includes a memory device including a first and a second memory circuit and a control circuit. The first memory circuit includes a first capacitor and a first transistor which has a function of holding charges held in the first capacitor. The second memory circuit includes a second transistor, a second capacitor which is electrically connected to a gate of the second transistor, and a third transistor which has a function of holding charges held in the second capacitor. The first and the third transistors each have a semiconductor layer including an oxide semiconductor, a gate, and a back gate. The voltage applied to the back gate of the first
(Continued)

or the third transistor is adjusted, whereby the memory region of each of the first and the second memory circuit is changed.

14 Claims, 24 Drawing Sheets

(51) Int. Cl.
*H01L 27/108* (2006.01)
*H01L 27/12* (2006.01)

(58) Field of Classification Search
CPC ............... H01L 27/108; H01L 27/1225; H01L 21/8258; H01L 29/78696; H01L 29/78648; H01L 29/7869; H01L 27/10897; H01L 27/0688
USPC .................................................. 365/149, 158
See application file for complete search history.

(56) References Cited

U.S. PATENT DOCUMENTS

| | | | |
|---|---|---|---|
| 9,449,706 B2 | 9/2016 | Yamazaki et al. | |
| 9,653,611 B2* | 5/2017 | Atsumi | G11C 11/403 |
| 9,959,212 B2 | 5/2018 | Takeda | |
| 9,959,919 B2 | 5/2018 | Saida et al. | |
| 9,959,932 B1* | 5/2018 | Zhang | G11C 16/10 |
| 10,192,871 B2 | 1/2019 | Onuki et al. | |
| 10,204,925 B2* | 2/2019 | Yoneda | H01L 27/1225 |
| 10,297,322 B2 | 5/2019 | Yamazaki et al. | |
| 10,388,364 B2* | 8/2019 | Ishizu | G11C 11/4099 |
| 2012/0051118 A1 | 3/2012 | Yamazaki et al. | |
| 2012/0294070 A1* | 11/2012 | Matsuzaki | H01L 27/1156 |
| | | | 365/149 |
| 2013/0100741 A1* | 4/2013 | Choi | G11C 5/02 |
| | | | 365/185.18 |
| 2013/0128673 A1* | 5/2013 | Terada | H01L 27/11582 |
| | | | 365/185.23 |
| 2014/0073126 A1* | 3/2014 | Shen | H01L 29/40114 |
| | | | 438/591 |
| 2014/0252443 A1* | 9/2014 | Kawai | H01L 27/11578 |
| | | | 257/314 |
| 2014/0286105 A1* | 9/2014 | Lin | G11C 16/0466 |
| | | | 365/185.24 |
| 2016/0099070 A1* | 4/2016 | Jiang | G11C 16/26 |
| | | | 365/185.21 |
| 2016/0247579 A1* | 8/2016 | Ueda | G11C 13/0002 |
| 2016/0267008 A1 | 9/2016 | Takeda | |
| 2016/0276008 A1 | 9/2016 | Saida et al. | |
| 2017/0083237 A1* | 3/2017 | Potash | G06F 8/44 |
| 2017/0207244 A1* | 7/2017 | Kato | H01L 29/24 |
| 2018/0018752 A1* | 1/2018 | Kurokawa | G09G 3/3291 |
| 2018/0024958 A1* | 1/2018 | Nachimuthu | G06F 9/5027 |
| | | | 711/117 |
| 2018/0090498 A1 | 3/2018 | Onuki et al. | |
| 2018/0130804 A1* | 5/2018 | Luan | H01L 21/8229 |
| 2018/0165396 A1* | 6/2018 | Lin | G06F 30/34 |
| 2018/0166460 A1* | 6/2018 | Manabe | H01L 29/517 |
| 2018/0175074 A1* | 6/2018 | Kurokawa | G09G 3/3677 |
| 2018/0357975 A1* | 12/2018 | Sone | G09G 3/3688 |
| 2019/0027211 A1* | 1/2019 | Morris | G11C 8/16 |

FOREIGN PATENT DOCUMENTS

| | | |
|---|---|---|
| JP | 2015-180994 A | 10/2015 |
| JP | 2016-170729 A | 9/2016 |
| JP | 2016-177689 A | 10/2016 |
| JP | 2018-056558 A | 4/2018 |
| JP | 2019-036280 A | 3/2019 |
| KR | 2013-0107285 A | 10/2013 |
| WO | WO-2012/026503 | 3/2012 |

OTHER PUBLICATIONS

Written Opinion (Application No. PCT/IB2019/053299) dated Jul. 16, 2019.

* cited by examiner

FIG. 3A
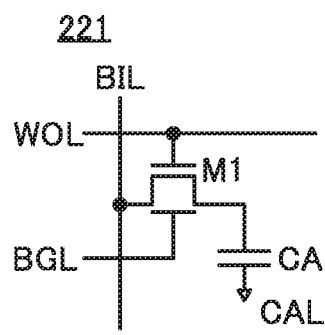
FIG. 3B1
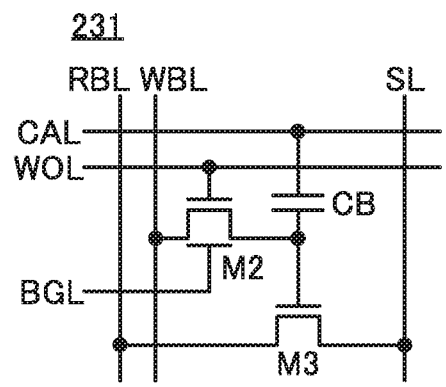
FIG. 3B2
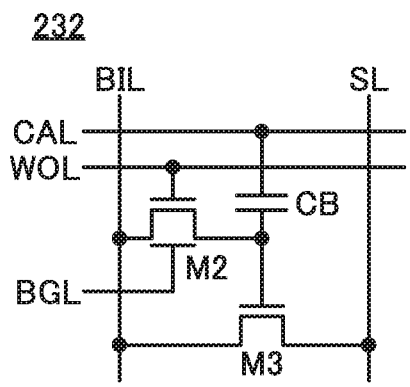

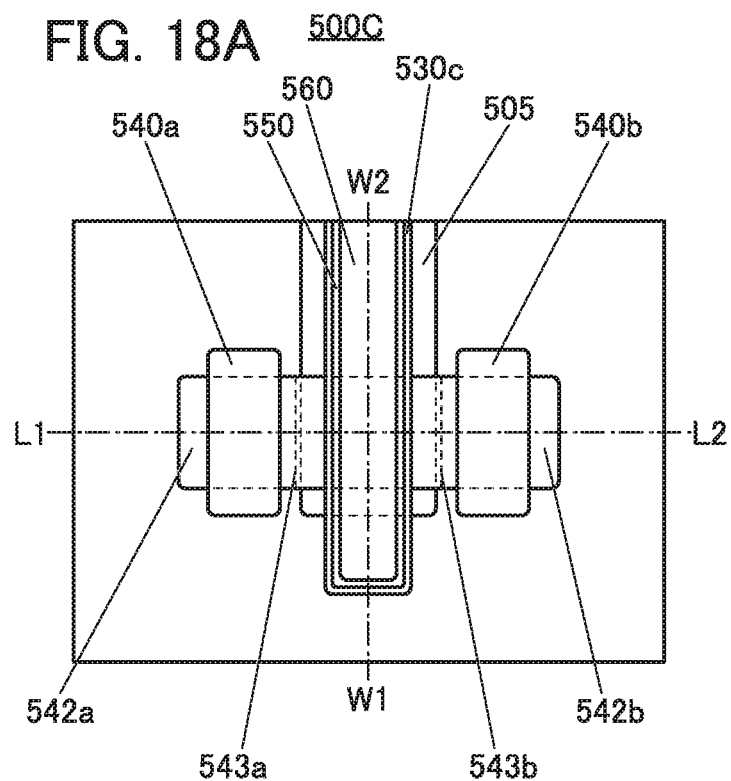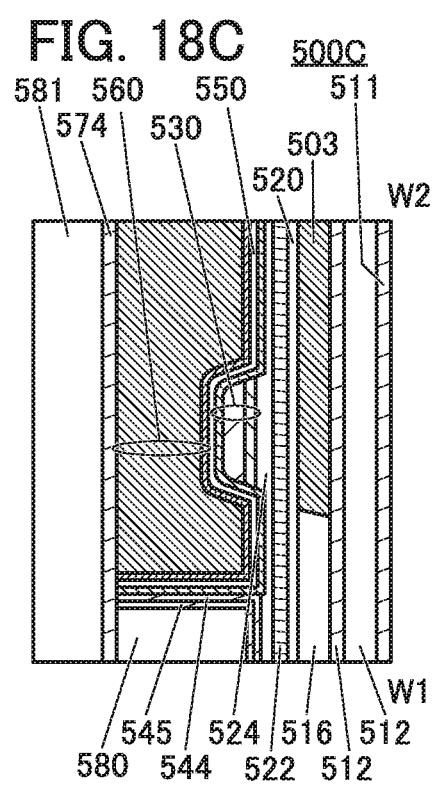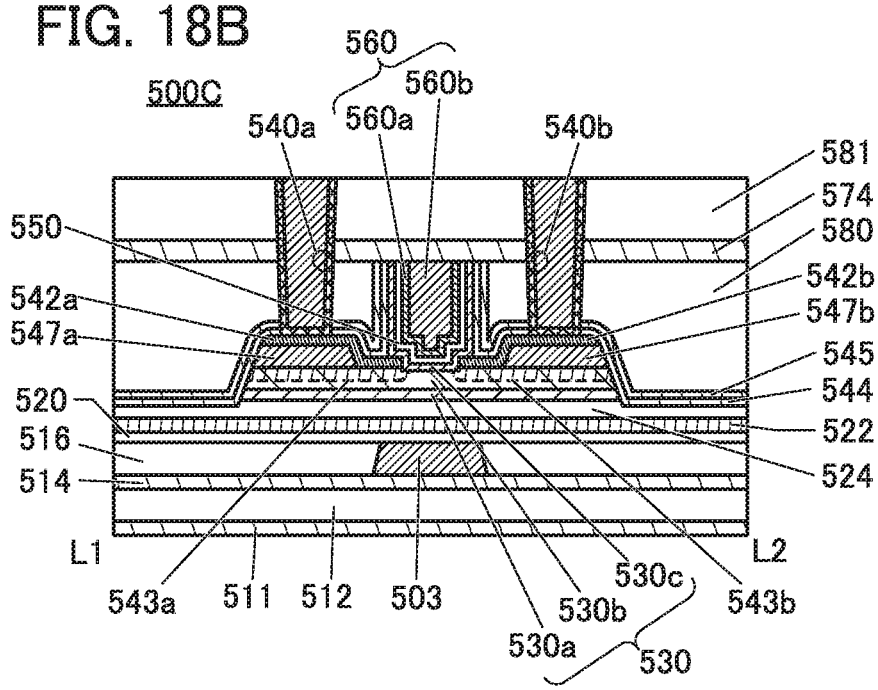

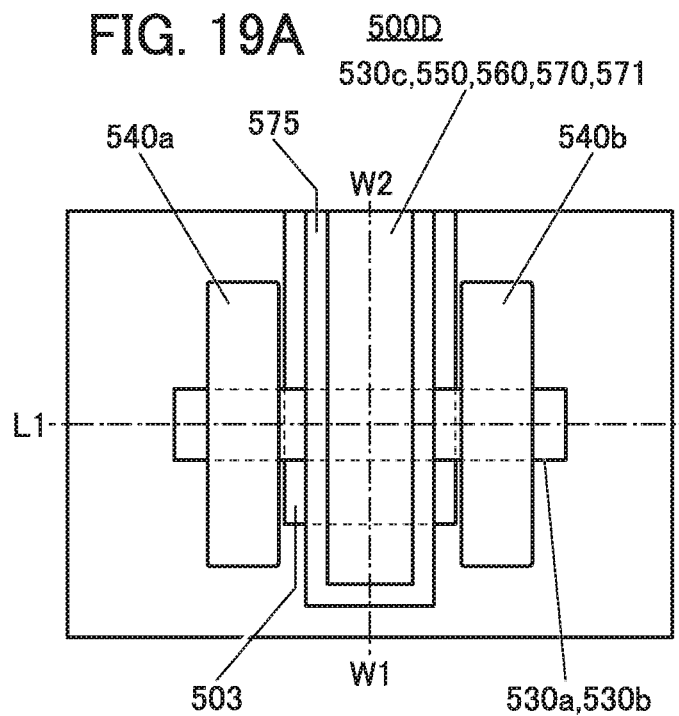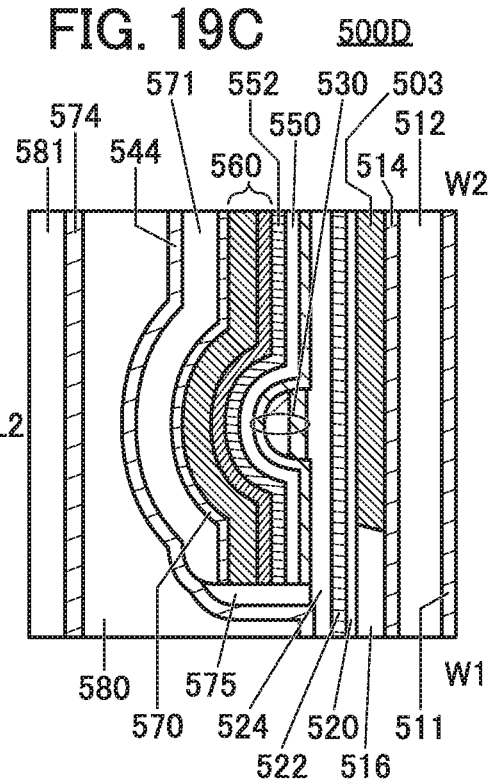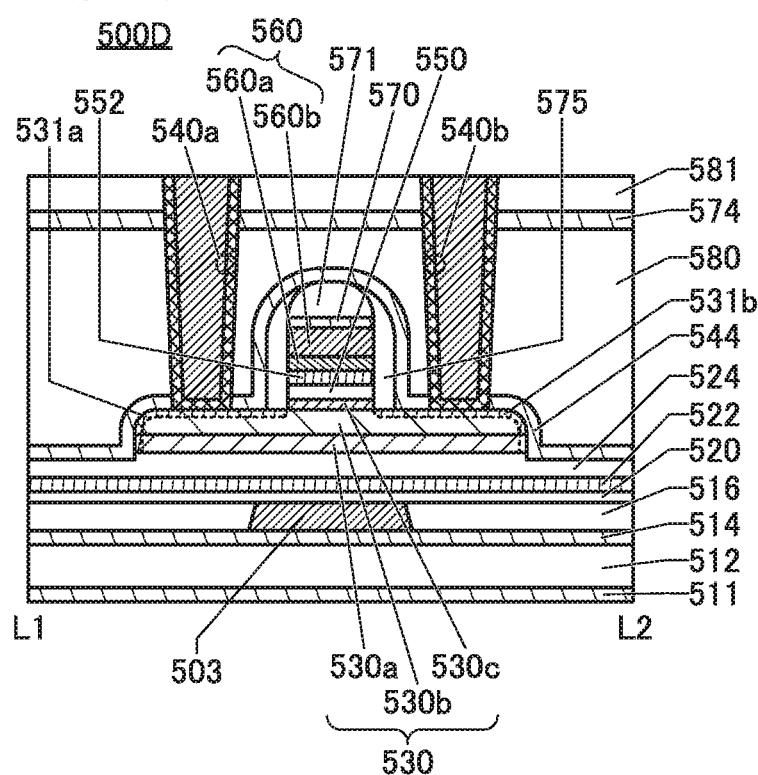

SEMICONDUCTOR DEVICE

TECHNICAL FIELD

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Alternatively, one embodiment of the present invention relates to a semiconductor device, a display device, a light-emitting device, a power storage device, a storage device, a driving method thereof, or a manufacturing method thereof.

BACKGROUND ART

A variety of structures of computer systems for data processing are proposed according to applications and many computer systems employ architectures in which a memory unit is divided into a plurality of levels and a memory device with different performance is allocated to each level. In such computer systems, a structure is well known in which memory devices such as resisters, cache memory devices, main memory devices, and auxiliary memory devices are provided.

Patent Document 1 discloses an invention in which a transistor including an oxide semiconductor in its semiconductor layer is used for a memory circuit and the memory circuit is used for a register, a cache memory device, and a main memory device. The oxide semiconductor has a wider band gap than silicon and the like and has a smaller intrinsic carrier concentration; thus, the transistor including an oxide semiconductor in its semiconductor layer has characteristics of an extremely low off-state current. Thus, the use of the transistor for a memory circuit enables stored data to be held for a long time.

REFERENCE

Patent Document

[Patent Document 1] Japanese Published Patent Application No. 2015-180994

SUMMARY OF THE INVENTION

Problems to be Solved by the Invention

Required performance for memory devices including resisters, cache memory devices, and main memory devices is different. Thus, it is difficult to share a memory region between the memory devices. Specifically, for example, it is difficult for a main memory device to compensate for the lack of capacity of a cache memory device when the cache memory device capacity runs short.

An object of one embodiment of the present invention is to provide a novel semiconductor device. Another object of one embodiment of the present invention is to provide a semiconductor device capable of reducing power consumption. Another object of one embodiment of the present invention is to provide a semiconductor device capable of reducing its area. Another object of one embodiment of the present invention is to provide a semiconductor device capable of expanding memory device capacity.

One embodiment of the present invention does not necessarily achieve all the above objects and only needs to achieve at least one of the objects. The descriptions of the above objects do not preclude the existence of other objects. Other objects will be apparent from and can be derived from the descriptions of the specification, the drawings, the claims, and the like.

Means for Solving the Problems (1)

One embodiment of the present invention is a semiconductor device including a memory device and a control circuit. The memory device includes a first memory circuit which operates in a first memory level and a second memory circuit which operates in a second memory level. The first memory level is a level with a higher access speed than the second memory level. The first memory circuit includes a first capacitor and a first transistor which has a function of holding charges held in the first capacitor. The second memory circuit includes a second transistor, a second capacitor which is electrically connected to a gate of the second transistor, and a third transistor which has a function of holding charges held in the second capacitor. The first and the third transistor each include a semiconductor layer including an oxide semiconductor, a first gate, and a second gate. The control circuit has a function of inputting a voltage to the second gate of the first transistor so that the first memory circuit is changed from the first memory level to the second memory level and a function of inputting a voltage to the second gate of the third transistor so that the second memory circuit is changed from the second memory level to the first memory level.

(2)

One embodiment of the present invention is the semiconductor device in the above (1) structure in which the control circuit includes a temperature sensing circuit. The temperature sensing circuit has a function of outputting a correction voltage depending on a temperature around the memory device. The control circuit has a function of changing a voltage applied to the second gate of each of the first transistor and the third transistor depending on the correction voltage.

(3)

One embodiment of the present invention is a semiconductor device including a memory device and a control circuit. The memory device includes a first memory circuit which operates in a first memory level and a second memory circuit which operates in a second memory level. The first memory level is a level with a higher access speed than the second memory level. The first memory circuit includes a first capacitor and a first transistor which has a function of holding charges held in the first capacitor. The second memory circuit includes a second transistor, a second capacitor which is electrically connected to a gate of the second transistor, and a third transistor which has a function of holding charges held in the second capacitor. The first and the third transistor each include a semiconductor layer including an oxide semiconductor, a first gate, and a second gate. The control circuit includes a function of inputting a voltage to the second gate of the first transistor so that the first memory circuit is changed from the first memory level to the second memory level and a function of inputting a voltage to the second gate of the third transistor so that the second memory circuit is changed from the second memory level to the first memory level. The control circuit also includes a controller, a plurality of voltage generation circuits, and a switching circuit. The memory device has a function of outputting a signal of using status of a memory capacity of the memory device to the controller. The controller has a function of controlling the switching circuit so that a voltage output from any one of the plurality of the voltage generation circuits is applied to the second gates of the first transistor and the third transistor in response to the signal.

(4)

One embodiment of the present invention is the semiconductor device in the above (3) structure in which the control circuit includes a temperature sensing circuit. The temperature sensing circuit has a function of outputting a correction voltage depending on a temperature around the memory device. The control circuit has a function of changing a voltage applied to the second gate of each of the first transistor and the third transistor depending on the correction voltage.

(5)

One embodiment of the present invention is a semiconductor device including a memory device and a control circuit. The memory device includes a first memory circuit which operates in a first memory level and a second memory circuit which operates in a second memory level. The first memory level is a level with a higher access speed than the second memory level. The first memory circuit includes a first capacitor and a first transistor which has a function of holding charges held in the first capacitor. The second memory circuit includes a second transistor, a second capacitor which is electrically connected to a gate of the second transistor, and a third transistor which has a function of holding charges held in the second capacitor. The first and the third transistor each include a semiconductor layer including an oxide semiconductor, a first gate, and a second gate. The control circuit includes a function of inputting a voltage to the second gate of the first transistor so that the first memory circuit is changed from the first memory level to the second memory level and a function of inputting a voltage to the second gate of the third transistor so that the second memory circuit is changed from the second memory level to the first memory level. The control circuit also includes a controller, a plurality of voltage generation circuits, and a switching circuit. The memory device has a function of outputting a signal of using status of a memory capacity of the memory device to the controller. The controller has a function of controlling the switching circuit so that a voltage output from any one of the plurality of the voltage generation circuits is applied to the second gates of the first transistor and the third transistor in response to the signal. The first memory circuit includes a region overlapping with the second memory circuit.

(6)

One embodiment of the present invention is the semiconductor device in the above (5) structure in which the control circuit includes a temperature sensing circuit. The temperature sensing circuit has a function of outputting a correction voltage depending on a temperature around the memory device. The control circuit has a function of changing a voltage applied to the second gate of each of the first transistor and the third transistor depending on the correction voltage.

(7)

One embodiment of the present invention is the semiconductor device in any one of the above (1) to (6) structures, in which the oxide semiconductor includes one or more materials selected from indium, an element M (the element M is aluminum, gallium, yttrium, or tin), and zinc.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relation shown in drawings or texts, a connection relationship other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, the switch has a function of being in a conduction state (on state) or a non-conduction state (off state) to determine whether current flows or not.

For example, in the case where X and Y are functionally connected, at least one circuit that enables functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected".

Alternatively, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

Furthermore, in this specification and the like, a transistor includes three terminals called a gate, a source, and a drain. The gate functions as a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms of a source and a drain are interchangeably used in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals.

Furthermore, in this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential. When the reference potential is a ground potential, for example, the "voltage" can be expressed as the "potential". The ground potential does not necessarily mean 0 V. Potentials are relative values, and the potential applied to a wiring or the like is changed depending on the reference potential, in some cases.

Generally, "current" is defined as a charge transfer (electrical conduction) in response to a transfer of positively charged particles; for example, the description "electrical conduction of positively charged particles" can be rephrased as "electrical conduction of negatively charged particles in the opposite direction". Therefore, unless otherwise specified, current in this specification and the like refers to a charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of current in a wiring or the like refers to the direction in which a positive carrier moves, and is expressed as a positive current amount. In other words, the direction in which a negative carrier moves is opposite to the direction of current, and is expressed as a negative current amount. Thus, in the case where the polarity of current (or the direction of current) is not specified in this specification and the like, the description "current flows from an element A to an element B" can be rephrased as "current flows from an element B to an element A", for example. The description "current is input to element A" can be rephrased as "current is output from element A".

Ordinal numbers such as "first," "second," and "third" in this specification and the like are used in order to avoid confusion among components. Thus, the terms do not limit the number of components. In addition, the terms do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

In this specification and the like, terms for describing arrangement, such as "over" and "under" are used for convenience to describe the positional relation between components with reference to drawings in some cases. The positional relation between components is changed as appropriate in accordance with a direction in which the components are described. Thus, terms for the description are not limited to terms used in the specification and the like, and description can be made appropriately depending on the situation. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly above or directly below and in direct contact with another component. For example, the expression "an electrode B over an insulating layer A" does not necessarily mean that the electrode B is formed on and in direct contact with the insulating layer A and does not exclude the case where another component is provided between the insulating layer A and the electrode B.

In this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, the terms "wiring", "signal line", "power supply line", and the like can be interchanged with each other depending on circumstances or conditions. For example, the term "wiring" can be changed into the term "signal line" in some cases. Also, for example, the term "wiring" can be changed into the term "power source line" in some cases. Inversely, the term "signal line", "power source line", or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies might be formed by entry of impurities such as hydrogen. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

In this specification and the like, a switch is in a conduction state (on state) or in a non-conduction state (off state) to determine whether current flows or not. Alternatively, a switch has a function of selecting and changing a current path. Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

Effect of the Invention

According to one embodiment of the present invention, a novel device can be provided. Alternatively, according to one embodiment of the present invention, a semiconductor device capable of reducing power consumption can be provided. Alternatively, according to one embodiment of the present invention, a semiconductor device capable of reducing its area can be provided. Alternatively, according to one embodiment of the present invention, a semiconductor device capable of expanding memory device capacity can be provided.

Note that the descriptions of the effects do not disturb the existence of other effects. Note that one embodiment of the present invention does not need to have all these effects. Effects other than these will be apparent from the descriptions of the specification, the drawings, the claims, and the like and effects other than these can be derived from the descriptions of the specification, the drawings, the claims, and the like.

BRIEF DESCRIPTION OF THE DRAWINGS

FIG. 18(A) is a top view showing a structure example of a transistor and FIGS. 18(B) and 18(C) are cross-sectional views showing the structure example of the transistor.

FIG. 19(A) is a top view showing a structure example of a transistor and FIGS. 19(B) and 19(C) are cross-sectional views showing the structure example of the transistor.

MODE FOR CARRYING OUT THE INVENTION

Figure 1A:
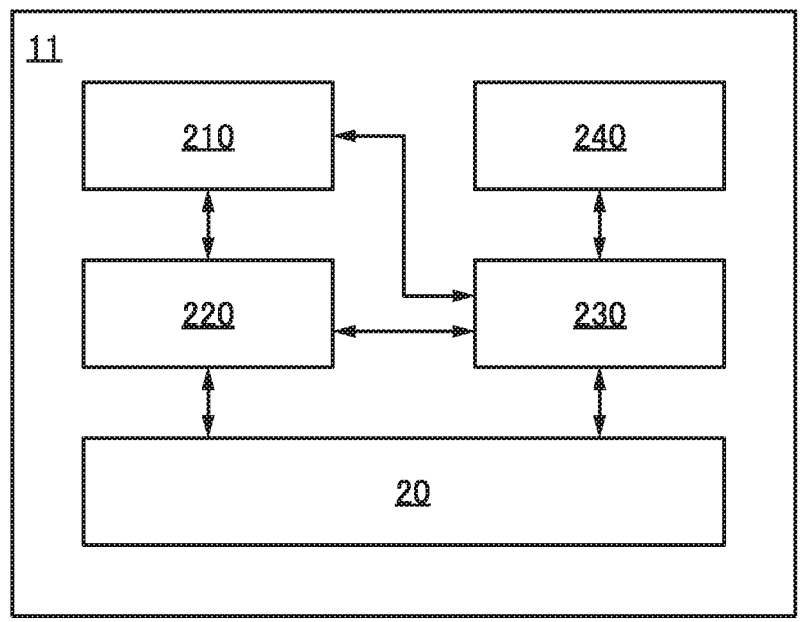
FIG. 1(A) is a block diagram showing a structure example of a memory device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. Moreover, when an OS FET or an OS transistor is described, it can also be referred to as a transistor including a metal oxide or an oxide semiconductor.

Furthermore, in this specification and the like, a metal oxide containing nitrogen is in some cases also collectively referred to as a metal oxide. A metal oxide containing nitrogen may be referred to as a metal oxynitride.

In this specification and the like, one embodiment of the present invention can be constituted by appropriately combining the structure described in an embodiment with any of the structures described in the other embodiments. In addition, in the case where a plurality of structure examples are described in one embodiment, the structure examples can be combined as appropriate Note that a content (or part of the content) described in one embodiment can be applied to, combined with, or replaced with at least one of another content (or part of the content) in the embodiment and a content (or part of the content) described in one or a plurality of different embodiments (or one or a plurality of different examples), for example.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in the specification are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. Also, in perspective views, some components might not be shown for clarity of the drawings.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, the following can be included: variation in signal, voltage, or current due to noise or difference in timing.

Embodiment 1

In this embodiment, structure examples of one embodiment of the present invention are described.

<Structure Example of Semiconductor Device>

FIG. 1(A) shows a structure example of a semiconductor device 11 of one embodiment of the present invention. The semiconductor device 11 includes a memory circuit 210, a memory circuit 220, a memory circuit 230, a memory circuit 240, and a control circuit 20 which constitute a memory device.

Although not shown in FIG. 1(A), the semiconductor device 11 includes an integrated circuit (a CPU and a GPU are given for example); the memory circuit 210 may be included in the integrated circuit, and the memory circuit 220 may be included in the integrated circuit.

In addition, a DOSRAM (Dynamic Oxide Semiconductor Random Access Memory) (registered trademark) can be used for the memory circuit 220 and a NOSRAM (Dynamic Oxide Semiconductor Random Access Memory) (registered trademark) can be used for the memory circuit 230. Note that the details of a DOSRAM and a NOSRAM are described later.

Figure 1B:
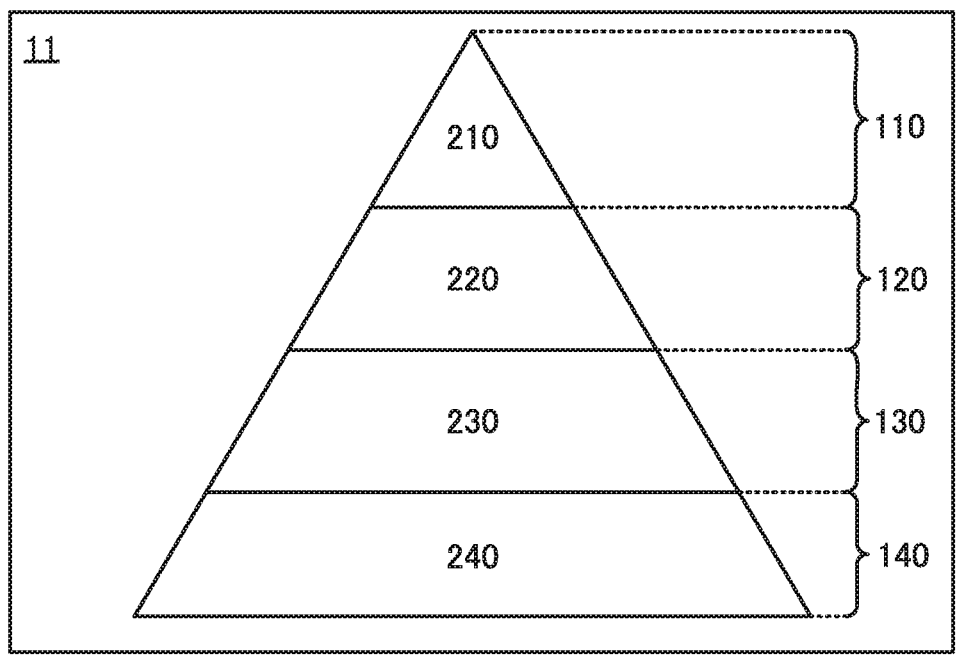
FIG. 1(B) is a diagram showing an example of levels of memory regions of the memory device.

FIG. 1(B) is a diagram of an example showing the memory circuits of the memory device included in the semiconductor device 11 shown in FIG. 1(A) by level.

FIG. 1(B) is a hierarchy of the memory circuits of the memory device included in the semiconductor device 11 in the order of access speed. The diagram shows that the memory circuit 210 is at the top level, the memory circuit 220 is at the level under the memory circuit 210, the memory circuit 230 is at the level under the memory circuit 220, and the memory circuit 240 is at the lowest level.

Note that in this specification and the like, the memory circuits of the memory device included in the semiconductor device 11 are called a first memory region 110, a second memory region 120, a third memory region 130, and a fourth memory region 140 in this order from the top. In particular, the first memory region 110 is used as a memory region for a register or the like, the second memory region 120 is used as a memory region for a cache memory device, the third memory region 130 is used as a memory region for a main memory device, and the fourth memory region 140 is used as a memory region for an auxiliary memory device.

The memory circuit 210 of the first memory region 110 holds the result and the state of an arithmetic operation of an integrated circuit or the like. Therefore, the memory circuit 210 is electrically connected to the memory circuit 220 and the memory circuit 230 to send and receive necessary data for the arithmetic operation.

The memory circuit 210 which can be used for the first memory region 110 includes a register, a flip-flop, an SRAM (Static Random Access Memory), and the like, for example.

Since the second memory region 120 is used as a memory region of a cache memory device, the memory circuit 220 holds part of data copied from the memory circuit 230 which is in the third memory region 130 and functions as a main memory device; thus, the memory circuit 220 is electrically connected to the memory circuit 230.

Figure 2:
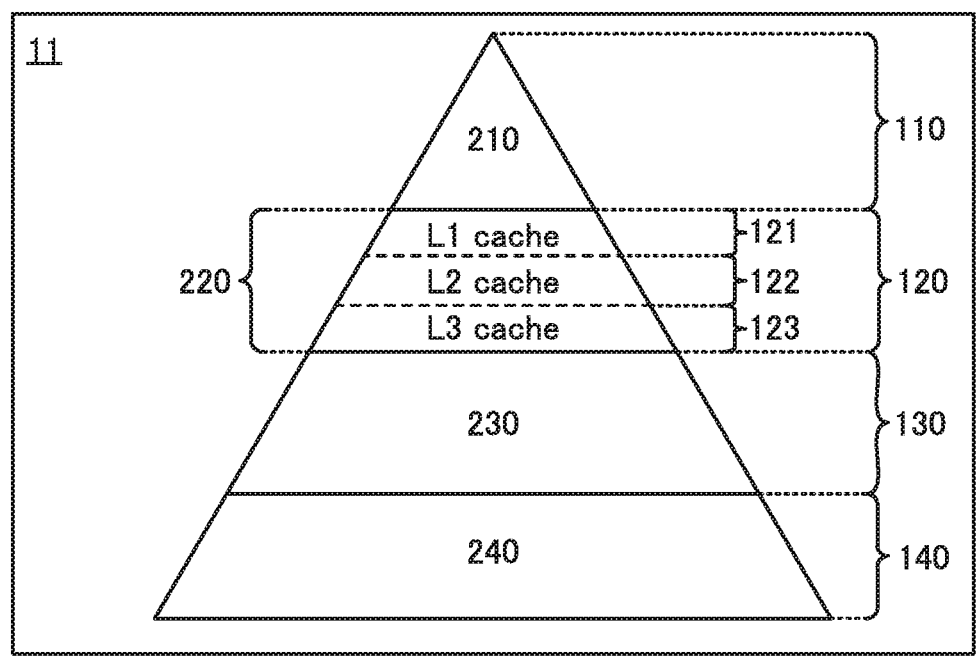
FIG. 2 is a diagram showing an example of levels of memory regions of a memory device FIGS. 3(A), (B1), and (B2) are circuit diagrams showing examples of memory cell structures included in a memory device.

The second memory region 120 corresponds to a memory region of a cache memory device, and thus the second memory region 120 can be divided further in a plurality of levels to be provided. For example, FIG. 2 shows the case where the memory circuit 220 is divided into three levels. The memory circuit 220 in FIG. 2 includes memory regions of a cache 121 to a cache 123; the cache 121 (primary cache, L1 cache) is provided at the level under the first memory region 110, the cache 122 (secondary cache, L2 cache) is provided at the level under the cache 121, and the cache 123 (tertiary cache, L3 cache) is provided at the level under the cache 122.

Note that the number of levels of the second memory region 120 is not limited to the above. In other words, the second memory region 120 may be composed of only one level, two levels, or more than or equal to four levels.

The memory circuit 240 which can be used for the fourth memory region 140 is electrically connected to the memory circuit 230 since the data input from the memory circuit 230 in the third memory region is held.

The memory circuit 240 that can be used for the fourth memory region 140 can include a nonvolatile memory or the like, for example. Examples of the nonvolatile memory include flash memories, hard disk drives, and solid-state drives.

The control circuit 20 is electrically connected to the memory circuit 220 and the memory circuit 230. The control circuit 20 has a function of changing a memory region at each level of the second memory region 120 and the third memory region 130 in the semiconductor device 11.

The higher the level of a memory circuit is, the higher operation speed is required. In addition, the lower the level of a memory circuit is, the larger capacity and the higher density (or the smaller area per bit) are required. For example, the first memory region 110 is required to have high operation speed since data used for arithmetic operation in an IC or the like is held. In addition, for example, the primary cache, which is positioned at the top level in the second memory region 120, is required to operate fast since the frequency of access is the highest. In contrast, although the secondary cache, the tertiary cache, and the like are not required to operate as fast as the primary cache, a large capacity is required and area per bit is required to be decreased.

Furthermore, the higher the level of a memory circuit is, the higher the data rewriting frequency (or refresh frequency) to the memory device becomes; thus, data holding time can be shorten as the specification of the memory device. In contrast, when the lower the level of a memory circuit is, the lower the data rewriting frequency (or refresh frequency) to the memory device becomes; thus, data holding time is required to be long as the specification of the memory device.

In one embodiment of the present invention, data holding time of the memory device at each level is changed to increase and decrease the memory region at each level in accordance with the using status of the semiconductor device. That is, the memory device or the semiconductor device of one embodiment of the present invention can change performance of the memory device at each level in accordance with the using status.

<Circuit Structure Example of DOSRAM and NOSRAM>

Next, circuit structures of a memory cell of the DOSRAM that can be used for the memory circuit 220 and a memory cell of the NOSRAM that can be used for the memory circuit 230 are described.

Note that a low-level potential and a high-level potential used in the following description do not represent any particular potentials, and specific potentials may be different between wirings. For example, a low-level potential and a high-level potential applied to the wiring WOL may be different from a low-level potential and a high-level potential applied to a wiring BIL.

FIG. 3(A) shows a circuit structure example of a memory cell of the DOSRAM. A memory cell 221 includes a transistor M1 and a capacitor CA. Note that the transistor M1 includes a front gate (simply referred to as a gate in some cases) and a back gate.

A first terminal of the transistor M1 is connected to a first terminal of the capacitor CA. A second terminal of the transistor M1 is connected to the wiring BIL. A gate of the transistor M1 is connected to the wiring WOL. A back gate of the transistor M1 is connected to a wiring BGL. A second terminal of the capacitor CA is connected to a wiring CAL.

The transistor M1 functions as a write transistor in the memory cell 221. Note that the write transistor is preferably an OS transistor described later.

The wiring BIL functions as a bit line, and the wiring WOL functions as a word line. The wiring CAL functions as a wiring for applying a predetermined potential to the second terminal of the capacitor CA. In data writing and reading, a low-level potential (referred to as reference potential in some cases) is preferably applied to the wiring CAL.

The wiring BGL functions as a wiring for applying a potential to the back gate of the transistor M1. By applying a freely selected potential to the wiring BGL, the threshold voltage of the transistor M1 can be increased or decreased.

Data writing and reading are performed in such a manner that a high-level potential is applied to the wiring WOL to turn on the transistor M1 so that continuity between the wiring BIL and the first terminal of the capacitor CA is established.

Specifically, data writing is performed by applying a potential corresponding to data to be written to the wiring BIL to write the potential to the first terminal of the capacitor CA through the transistor M1. After data writing, a low-level potential is applied to the wiring WOL to turn off the transistor M1, whereby the potential can be held in the memory cell 221.

In data reading, first, the wiring BIL is precharged at an appropriate potential, such as a middle potential between a low-level potential and a high-level potential, and then the wiring BIL is brought into an electrically floating state. After that, a high-level potential is applied to the wiring WOL to turn on the transistor M1, so that the potential of the wiring BIL is changed. Since the potential of the wiring BIL changes depending on the potential written to the first terminal of the capacitor CA, data held in the memory cell 221 can be read using the changed potential of the wiring BIL.

The memory cell 221 described above is not limited to the circuit structure shown in FIG. 3(A), and the circuit structure of the memory cell 221 may be changed as appropriate.

FIG. 3(B1) shows a circuit structure example of a memory cell of the NOSRAM. A memory cell 231 includes a transistor M2, a transistor M3, and a capacitor CB. Note that the transistor M2 includes a front gate (simply referred to as a gate in some cases) and a back gate.

The transistor M2 functions as a write transistor in the memory cell 231. Note that the write transistor is preferably an OS transistor described later.

The transistor M3 functions as a read transistor in the memory cell 231. The read transistor is preferably an OS transistor, which is described later, or a transistor whose semiconductor layer includes silicon. Note that, in this operation example, the transistor M3 is assumed to operate in a saturation region unless otherwise specified. In other words, the gate voltage, the source voltage, and the drain voltage of the transistor M3 are assumed to be appropriately biased to voltages in the range where the transistor operates in the saturation region.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. When data is held, a low-level potential (referred to as a reference potential in some cases) is preferably applied to the wiring CAL and when data is written and when data is read, a high-level potential is preferably applied to the wiring CAL.

The wiring BGL functions as a wiring for applying a potential to the back gate of the transistor M2. By applying a freely selected potential to the wiring BGL, the threshold voltage of the transistor M2 can be increased or decreased.

Data writing is performed in such a manner that a high-level potential is applied to the wiring WOL to turn on the transistor M2, so that continuity between the wiring WBL and the first terminal of the capacitor CB is established. Specifically, when the transistor M2 is in an on state, a potential corresponding to information stored in the wiring WBL is applied, whereby the potential is written to the first terminal of the capacitor CB and the gate of the transistor M3. After that, a low-level potential is applied to the wiring WOL to turn off the transistor M2, whereby the potential of the first terminal of the capacitor CB and the potential of the gate of the transistor M3 are held.

Data reading is performed by applying a predetermined potential to the wiring SL. The current flowing between a source and a drain of the transistor M3 and the potential of the first terminal of the transistor M3 are determined by the potential of the gate of the transistor M3 and the potential of the second terminal of the transistor M3. Thus, the potential of the wiring RBL electrically connected to the first terminal of the transistor M3 is read out, so that the potential of the first terminal of the capacitor CB (or the gate of the transistor M3) can be read out. In other words, data written into this memory cell can be read out from the potential held in the first terminal of the capacitor CB (or the gate of the transistor M3).

The memory cell 231 described above is not limited to the circuit structure shown in FIG. 3(B1) and the circuit structure of the memory cell 231 may be changed as appropriate. For example, the wiring WBL and the wiring RBL may be combined into one wiring BIL. FIG. 3(B2) shows a circuit structure example of such a memory cell. In a memory cell 232, one wiring BIL corresponds to the wiring WBL and the wiring RBL in the memory cell 231, and the second terminal of the transistor M2 and the first terminal of the transistor M3 are connected to the wiring BIL. In other words, the memory cell 232 operates with one wiring BIL functioning as a write bit line and a read bit line.

The DOSRAM and the NOSRAM are memory devices including OS transistors as write transistors, as described above. The semiconductor layer of the OS transistor includes a metal oxide described in Embodiment 3. For example, one or more materials selected from indium, an element M (M is aluminum, gallium, yttrium, or tin), and zinc can be used for the metal oxide. In particular, when a metal oxide including indium, gallium, and zinc is included in the semiconductor layer, the band gap of the semiconductor layer can be increased. Thus, the off-state current of the OS transistor can be reduced.

<Changing Method of Memory Region at Each Level of Memory Device>

The OS transistor with the structure described in Embodiment 3 can have a back gate. In the OS transistor including a back gate, a potential is applied to the back gate, whereby the threshold voltage of the OS transistor can be changed. For example, when the OS transistor is an n-channel transistor, the threshold voltage of the OS transistor can be shifted in the negative direction by applying a positive potential to the back gate and the threshold voltage of the OS transistor can be shifted in the positive direction by applying a negative potential to the back gate.

The off-state current of the OS transistor can be increased and decreased by changing the threshold voltage of the OS transistor. In the case where the off-state current of the OS transistor is increased, the transfer speed of electric charges corresponding to the held data between the source and drain of the OS transistor becomes fast; thus, the data holding time is shortened and the operation speed of the OS transistor (sometimes referred to as driving frequency) can be increased. In the case where the off-state current of the OS transistor is decreased, the transfer speed of electric charges corresponding to the held data between the source and drain of the OS transistor becomes slow; thus, the data holding time is prolonged and the operation speed of the OS transistor can be decreased. That is, the data holding time and the operation speed can be adjusted by changing the threshold voltage of the OS transistor.

Here, the case where the DOSRAM is used as the memory circuit 220 and the NOSRAM is used as the memory circuit 230 of the semiconductor device 11 is considered. For example, in the semiconductor device 11 in FIGS. 1(A) and 1(B), when the memory circuit 210 used as the first memory region is short of memory capacity and the memory circuit 220 used as the second memory region 120 has an extra memory capacity, as shown in FIG. 4(A), the threshold voltage of the OS transistor included in a memory circuit 220a which is part of the memory circuit 220 is lowered to shorten the data holding time of the memory circuit 220a and increase the operation speed, whereby the memory circuit 220a can be used as the first memory region 110.

Specifically, when the transistor M1 in the memory cell 221 of the memory circuit 220a is operated with a voltage applied to the gate higher than or equal to −0.8 V and lower than or equal to 2.5 V, a voltage higher than or equal to −1.5 V and lower than 1.5 V is applied to the back gate of the transistor M1, for example, whereby the memory circuit 220a can be used as the first memory region 110.

Figure 4A:
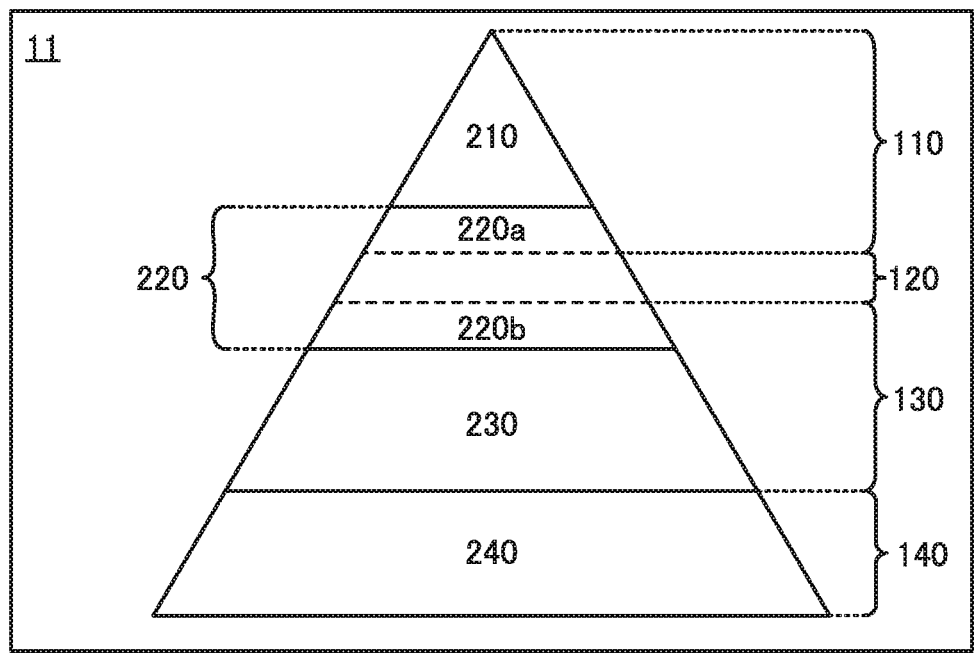
FIGS. 4(A) and 4(B) are diagrams showing examples of levels of memory regions of a memory device.

Furthermore, for example, in the semiconductor device 11 in FIGS. 1(A) and 1(B), when the memory circuit 230 used as the third memory region 130 is short of memory capacity and the memory circuit 220 used as the second memory region 120 has an extra memory capacity, as shown in FIG. 4(A), the threshold voltage of the OS transistor included in a memory circuit 220b which is part of the memory circuit 220 is increased to prolong the data held time of the memory circuit 220b and decrease the operation speed, whereby the memory circuit 220b can be used as the third memory region 130.

Specifically, in the case where the transistor M1 in the memory cell 221 of the memory circuit 220b is operated with a voltage applied to the gate higher than or equal to −0.8 V and lower than or equal to 2.5 V, a voltage higher than or equal to −7.5 V and lower than −4.5 V is applied to the back gate of the transistor M1, for example, whereby the memory circuit 220b can be used as the third memory region 130.

Note that when the memory region of the memory circuit 220 in the semiconductor device 11 in FIGS. 1(A) and 1(B) is not changed to a memory region at another level, that is, the memory circuit 220 is intended to normally operate as the second memory region 120, a potential applied to the gate of the transistor M1 ranges from −0.8 V to 2.5 V and a potential applied to the back gate of the transistor M1 ranges from −4.5 V to −1.5 V, for example.

Figure 4B:
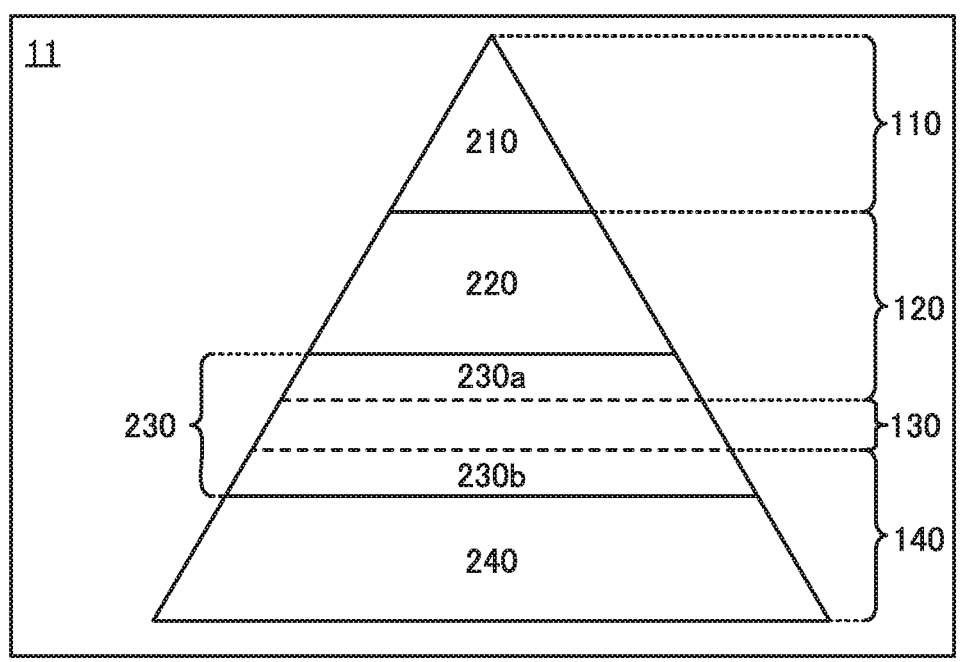

Furthermore, for example, in the semiconductor device 11 in FIGS. 1(A) and 1(B), when the memory circuit 220 used as the second memory region 120 is short of memory capacity and the memory circuit 230 used as the third memory region 130 has an extra memory capacity, as shown in FIG. 4(B), the threshold voltage of the OS transistor included in a memory circuit 230a which is part of the memory circuit 230 is lowered to shorten the data holding time of the memory circuit 230a, whereby the memory circuit 230a can be used as the second memory region 120.

Specifically, in the case where the transistor M2 in the memory cell 231 (memory cell 232) of the memory circuit 230a is operated with a voltage applied to the gate higher than or equal to −0.8 V and lower than or equal to 2.5 V, a voltage higher than or equal to −4.5 V and lower than −1.5 V is applied to the back gate of the transistor M2, for example, whereby the memory circuit 230a can be used as the second memory region 120.

Furthermore, for example, in the semiconductor device 11 in FIGS. 1(A) and 1(B), when the memory circuit 240 used as the fourth memory region 140 is short of memory capacity and the memory circuit 230 used as the third memory region 130 has an extra memory capacity, as shown in FIG. 4(B), the threshold voltage of the OS transistor included in a memory circuit 230b which is part of the memory circuit 230 is increased to prolong the data holding time of the memory circuit 230b, whereby the memory circuit 230b can be used as the fourth memory region 140.

Specifically, in the case where the transistor M2 in the memory cell 231 (memory cell 232) of the memory circuit 230b is operated with a voltage applied to the gate higher than or equal to −0.8 V and lower than or equal to 2.5 V, a voltage lower than −7.5 V is applied to the back gate of the transistor M2, for example, whereby the memory circuit 230b can be used as the fourth memory region 140.

Note that in the case where the memory region of the memory circuit 230 in the semiconductor device 11 in FIGS. 1(A) and 1(B) is not changed to a memory region at another level, that is, the memory circuit 230 is intended to normally operate as the third memory region 130, a potential applied to the gate of the transistor M1 ranges from −0.8 V to 2.5 V and a potential applied to the back gate of the transistor M1 ranges from −7.5 V to lower than −4.5 V, for example.

In addition, voltages applied to the gate of the transistor M1 of the memory cell 221 and the gate of the transistor M2 of the memory cell 231 (memory cell 232) can be in almost the same range. Specifically, the same circuit can be used for circuits for generating positive voltages (or negative voltages) applied to the gate of the transistor M1 and the gate of the transistor M2. Thus, the number of circuits for generating voltages applied to the gates of the transistor M1 and the transistor M2 does not need to be large, whereby power consumption of the semiconductor device 11 can be reduced. In particular, in the case where a negative voltage is applied to the gates of the transistors, power consumption for generating the negative voltage might be increased; thus, it is preferable to share a circuit for generating a negative voltage (e.g., a charge pump circuit can be given), which is applied to each gate of the transistor M1 and the transistor M2.

The ranges of the voltages applied to the gate and back gate of the transistor M1 (the transistor M2) are examples. Transistor characteristics in a semiconductor device in general change depending on materials, structures, or the like of a semiconductor layer of the transistor included in the semiconductor device; thus, the range of the voltage applied to the gate and back gate needs to be set for each circumstance.

Furthermore, transistor characteristics of a semiconductor device in general change depending on an environment where the semiconductor device drives. Specifically, the higher the temperature of the environment where the semiconductor device drives becomes, the higher the drain current corresponding to the voltage between the gate and source becomes and the higher the driving frequency of the transistor becomes. That is, performance of the semiconductor device may be changed depending on the environmental temperature. Therefore, the semiconductor device preferably has a structure in which transistor characteristics are appropriately adjusted by changing the voltage applied to the back gate of an OS transistor which is a write transistor depending on the environmental temperature. In other words, a voltage appropriate for the environmental temperature where the semiconductor device 11 drives is applied to each back gate of the transistor M1 and transistor M2 included in the memory cell 221 and the memory cell 231 (memory cell 232), whereby the memory circuit 220 and memory circuit 230 can operate appropriately in the environmental temperature.

<Control Circuit 20>

Next, a circuit structure for controlling the threshold voltages of the write transistors included in the memory circuit 220 and the memory circuit 230 (corresponding to the transistor M1 in FIG. 3(A) and the transistor M2 in FIGS. 3(B1) and 3(B2)) is described.

Figure 5:
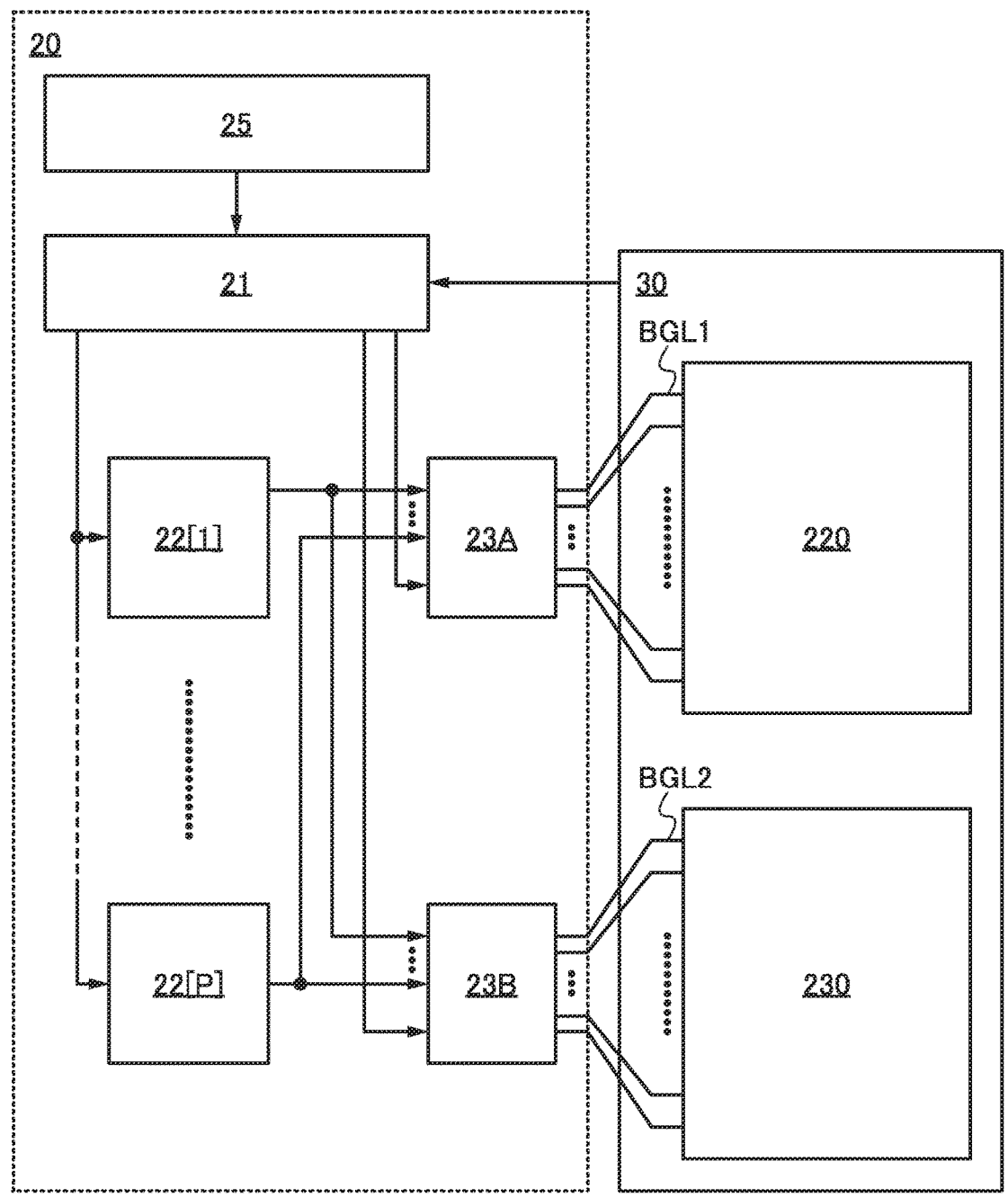
FIG. 5 is a block diagram showing a structure example of a memory device.

FIG. 5 is a block diagram showing the control circuit 20 for controlling the threshold voltages of the write transistors. Note that in FIG. 5, a memory unit 30 including the memory circuit 220 and the memory circuit 230 is shown to describe an electrical connection with the memory device.

The control circuit 20 includes a control unit 21, a voltage generation circuit 22[1] to a voltage generation circuit 22[P] (P is an integer greater than or equal to 1), a circuit 23A, a circuit 23B, and a temperature sensing circuit 25. In the case where the potential of the back gate is not changed depending on the environmental temperature, the control circuit 20 can have a structure without the temperature sensing circuit 25.

The control unit 21 is electrically connected to the memory unit 30, the voltage generation circuit 22[1] to the voltage generation circuit 22[P], the circuit 23A, the circuit 23B, and the temperature sensing circuit 25. Each of the voltage generation circuit 22[1] to the voltage generation circuit 22[P] is electrically connected to the circuit 23A and the circuit 23B. The circuit 23A is electrically connected to the memory circuit 220 through a plurality of wirings BGL1, and the circuit 23B is electrically connected to the memory circuit 230 through a plurality of wirings BGL2.

The memory unit 30 has a function of sending a signal about each using status of the memory circuit 220 and the memory circuit 230 (e.g., a proportion of the memory capacity used to the whole memory capacity) to the control unit 21. The control unit 21 receives the signal, and then sends signals to circuits included in the control circuit 20 to change the allocation of each level of the memory unit 30 (e.g., the first memory region 110, the second memory region 120, the third memory region 130, and the fourth memory region 140 shown in FIG. 1(B)), according to the using status. Specifically, the control unit 21 sends signals to the voltage generation circuit 22[1] to the voltage generation circuit 22[P], the circuit 23A, and the circuit 23B.

Each of the voltage generation circuit 22[1] to the voltage generation circuit 22[P] has a function of generating a voltage applied to the back gates of the write transistors. Furthermore, the voltage generation circuit 22[1] to the voltage generation circuit 22[P] have a function of starting or stopping generation of the voltage in response to signals sent from the control unit 21. Owing to this function, voltage generation circuits necessary for generating a voltage in the allocation of each level of the memory unit 30 are driven and unnecessary voltage generation circuits can be stopped. Therefore, only necessary circuits of the voltage generation circuit 22[1] to the voltage generation circuit 22[P] can be driven and power consumption of the control circuit 20 can be reduced.

Furthermore, a charge pump circuit can be used for a circuit that generates a negative voltage among the voltage generation circuit 22[1] to the voltage generation circuit 22[P], for example.

The circuit 23A has a function of selecting a voltage applied to each of the plurality of the wirings BGL1 from voltages generated by the voltage generation circuit 22[1] to the voltage generation circuit 22[P]. Note that which voltage is selected for each of the plurality of the wirings BGL1 is determined according to the signal sent from the control unit 21. Owing to this function, a predetermined voltage can be applied from the wiring BGL1 to the back gate of the write transistor included in the memory circuit 220, so that the memory circuit 220 can be divided into regions corresponding to the allocated levels. For example, when the memory circuit 220 is divided into p (p is an integer greater than or equal to 2 and less than or equal to P) levels, the circuit 23A applies p-types of voltages to the plurality of the wirings BGL1 to divide the memory circuit 220 into p regions.

Similarly, the circuit 23B has a function of selecting a voltage applied to each of the plurality of the wirings BGL2 from voltages generated by the voltage generation circuit 22[1] to the voltage generation circuit 22[P]. Note that which voltage is selected for each of the plurality of the wirings BGL2 is determined according to the signal sent from the control unit 21. Owing to this function, a predetermined voltage can be applied from the wiring BGL2 to the back gate of the write transistor included in the memory circuit 230, so that the memory circuit 230 can be divided into regions corresponding to the allocated levels.

<Operation Example>

Here, an operation example of the control circuit 20 is described. Note that in this operation example, the case where the potential of the back gate is not changed depending on the environmental temperature is described.

Figure 6:
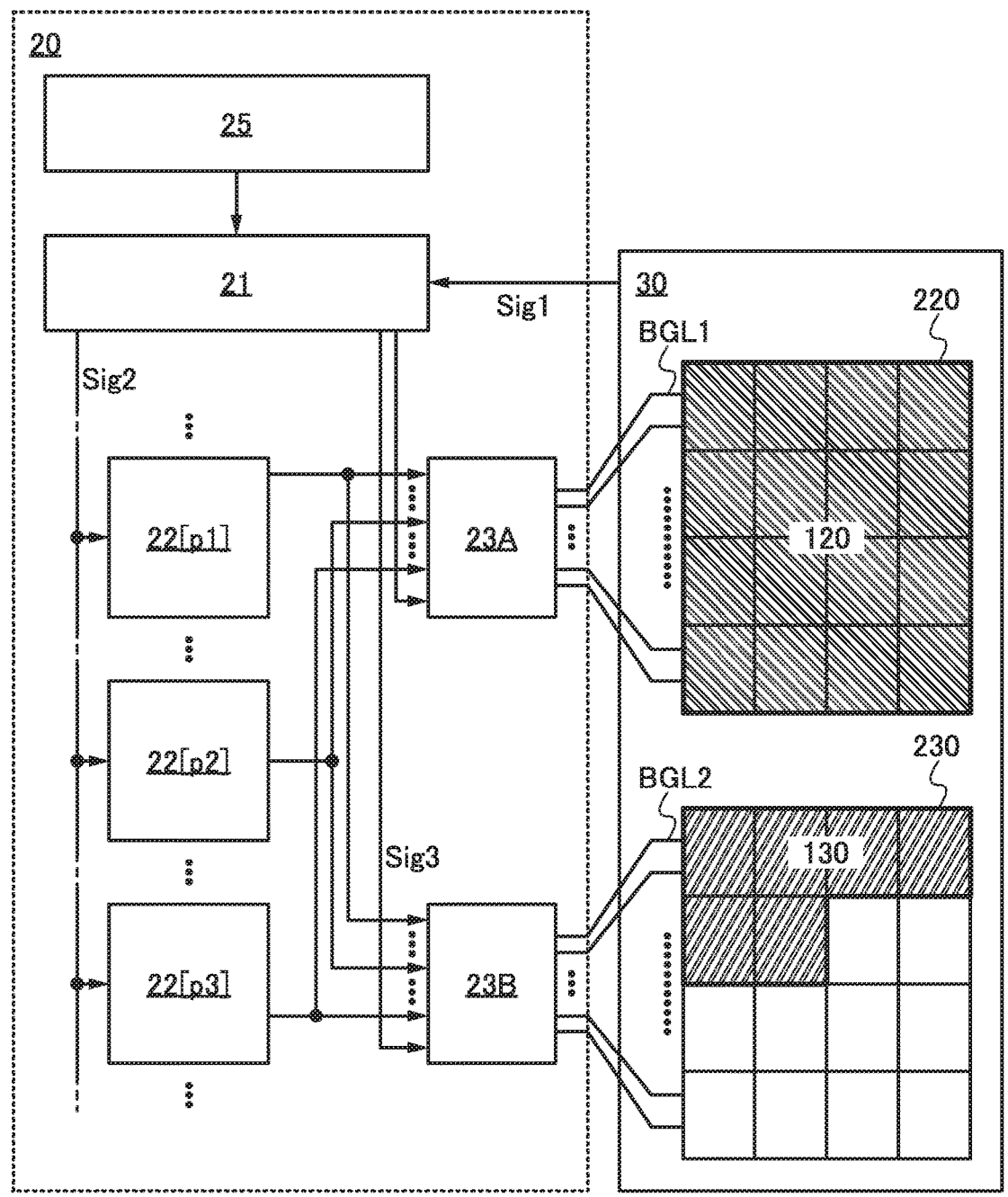
FIG. 6 is a block diagram showing a structure example of a memory device.

As an initial step of the operation example, for example, as the using status of the memory unit 30, the case is considered where the whole memory capacity of the memory circuit 220 to which the second memory region 120 is allocated is used for holing data and part of the memory capacity of the memory circuit 230 to which the third memory region 130 is allocated is used for holding data as shown in FIG. 6. Note that at this point, a voltage generation circuit 22[$p1$] (p1 is an integer greater than or equal to 1 and less than or equal to P) generates a voltage applied to the back gates of the write transistors included in the memory cells used for the second memory region 120 among the memory cells in the memory circuit 220 and a voltage generation circuit 22[$p2$] (p2 is an integer greater than or equal to 1 and less than or equal to P and not p1) generates a voltage applied to the back gates of the write transistors included in the memory cells used for the third memory region 130 among the memory cells in the memory circuit 230.

In this case, when the memory unit 30 determines that the second memory region 120 is short of memory capacity, the memory unit 30 sends a signal Sig1 to the control unit 21 that the whole memory capacity of the memory circuit 220 is in use and part of the memory capacity of the memory circuit 230 is available.

Receiving the signal, the control unit 21 sends a signal Sig2 to the voltage generation circuit 22[1] to the voltage generation circuit 22[P] and sends a signal Sig3 to the circuit 23B. The signal Sig2 and the signal Sig3 are signals for allocating the second memory region 120 to the memory circuit 230.

Specifically, in order to allocate the second memory region 120 to the predetermined region of the memory circuit 230, the signal Sig2 can be a signal for selecting a circuit generating a voltage applied to the back gate of the write transistor included in the region. Here, a voltage generation circuit 22[p3] (p3 is an integer greater than or equal to 1 and less than or equal to P and not p2) is selected here. The voltage generation circuit 22[p3] may be the same as the voltage generation circuit 22[p1] or a different circuit.

Note that the structure may be employed in which the voltage generation circuit which is not selected by the signal Sig2 is stopped as described above. For example, when an electrical connection between a voltage generation circuit and a wiring for supplying a driving voltage is made to be a non-conduction state by a switching element or the like, the voltage generation circuit can be stopped. With this, only the necessary voltage generation circuit is driven, so that power consumption of the control circuit 20 can be reduced.

The signal Sig3 can be a signal including an instruction that a voltage generated in the voltage generation circuit 22[p3] is applied to the BGL2 which is electrically connected to the back gate of the write transistor in the predetermined region of the memory circuit 230. The signal Sig3 still may include an instruction that a voltage generated in the voltage generation circuit 22[p2] is applied to the back gate of the write transistor included in the region of the third memory region 130 in the memory circuit 230.

Figure 7:
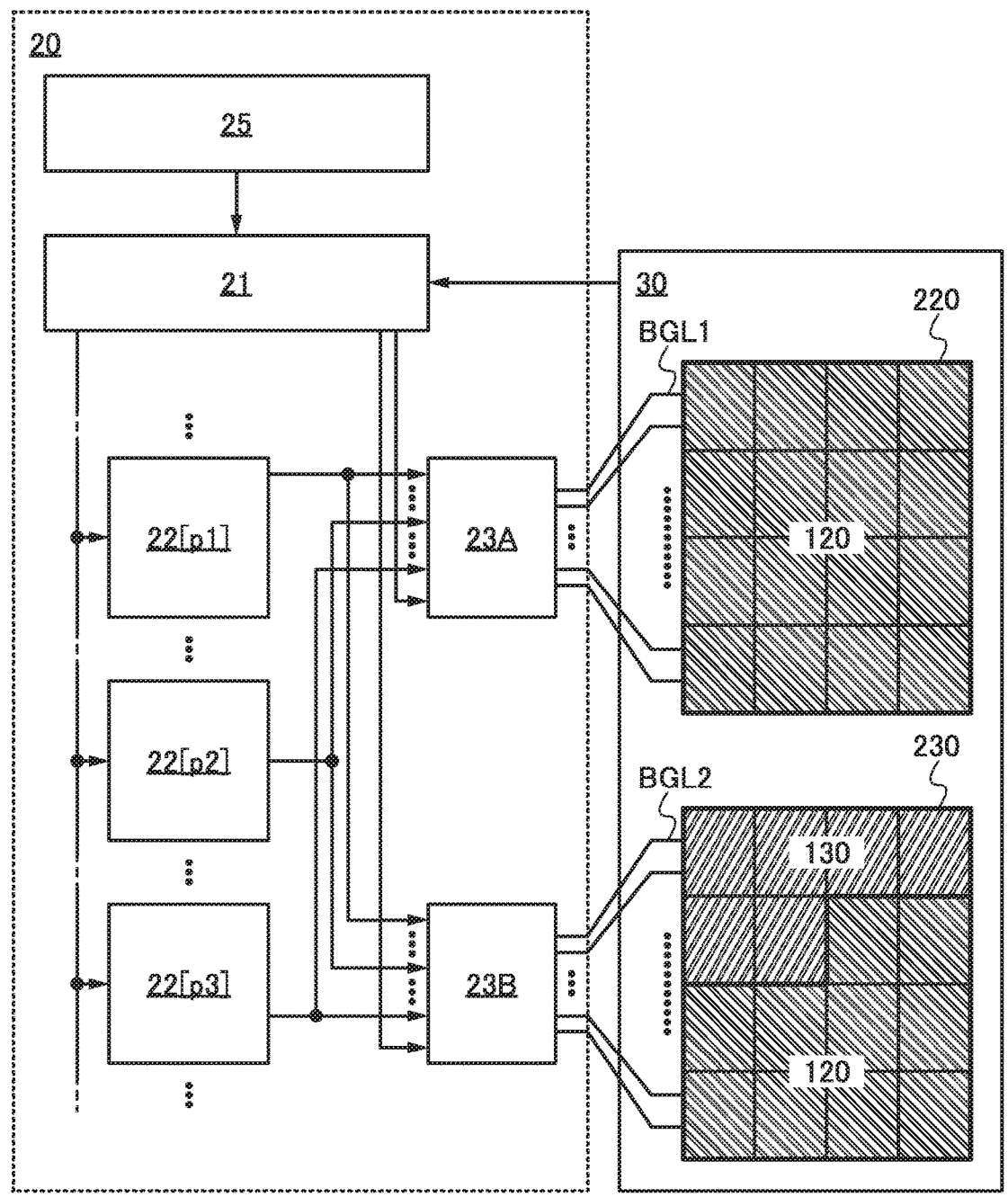
FIG. 7 is a block diagram showing a structure example of a memory device.

The signal Sig3 is sent to the circuit 23B, whereby the voltage generated in the voltage generation circuit 22[p3] can be applied to the back gate of the write transistor in the region of the memory circuit 230 to which the second memory region 120 is newly allocated, for example. Thus, the second memory region 120 can be allocated to the predetermined region of the memory circuit 230. The block diagram of FIG. 7 shows a subsequent state of the block diagram of FIG. 6 and shows an example in which the signal Sig3 is sent to the circuit 23B and the second memory region 120 is allocated to all the remaining regions where the memory capacity is available in the memory circuit 230 of the memory unit 30.

<Temperature Control>

Next, a method for changing potentials applied to the back gates of the write transistors of the memory unit 30 (the transistor M1 and the transistor M2) depending on environmental temperature is described.

Figure 8:
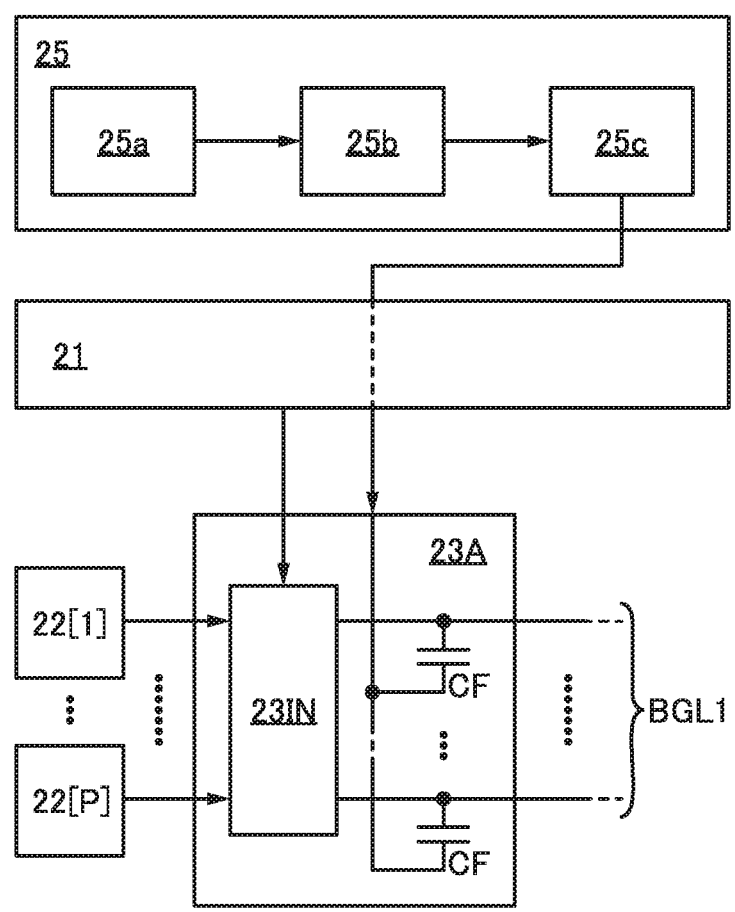
FIG. 8 is a block diagram showing a structure example of a memory device.

The temperature sensing circuit 25 can have a structure shown in FIG. 8, for example. Note that to describe the electrical connection structure with the temperature sensing circuit 25, FIG. 8 also shows the control unit 21, the voltage generation circuit 22[1], the voltage generation circuit 22[P], the circuit 23A, and the wiring BGL1. Note that the circuit 23B, the wiring BGL2, and the memory unit 30 are omitted.

The temperature sensing circuit 25 includes a temperature sensor 25a, an analog-to-digital converter circuit 25b, and a voltage control circuit 25c.

The temperature sensor 25a has a function of sensing the temperature around the semiconductor device 11 and outputting an analog signal corresponding to the temperature. The output analog signal is sent to the analog-to-digital converter circuit 25b. As the temperature sensor 25a, for example, a resistance thermometer of platinum, nickel, or copper, a thermistor, a thermocouple, an IC temperature sensor, or the like can be used.

The analog-to-digital converter circuit 25b has a function of converting an analog signal to a digital signal. The digital signal is sent to the voltage control circuit 25c.

The voltage control circuit 25c has a function of generating a correction voltage in response to the digital signal. For example, the voltage control circuit 25c includes a memory device in which a correspondence table is stored to match the digital signal to a correction voltage and a circuit generating a correction voltage, and reads the level of the correction voltage that corresponds to the digital signal sent from the analog-to-digital converter circuit 25b. After reading the level of the correction voltage, the correction voltage is generated by the circuit generating a correction voltage and sent to the circuit 23A and the circuit 23B through the control unit 21. Note that in FIG. 5, FIG. 6, FIG. 7, and FIG. 8, the temperature sensing circuit 25 is electrically connected to the control unit 21; however, the temperature sensing circuit 25 may be directly and electrically connected to the circuit 23A and the circuit 23B.

Here, the circuit 23A (the circuit 23B) includes a plurality of capacitors CF, and one electrode of two pairs of electrodes of the plurality of the capacitors CF is electrically connected to a plurality of the wirings BGL1 (a plurality of the wirings BGL2). The correction voltage sent to the circuit 23A (the circuit 23B) is applied to the other of the two pairs of the electrodes of the capacitors CF.

The circuit 23A (the circuit 23B) includes an internal circuit 23IN. The internal circuit 23IN has a function of applying a plurality of kinds of voltages generated by the voltage generation circuit 22[1] to the voltage generation circuit 22[P] to each of the plurality of the wirings BGL1 (the plurality of the wirings BGL2) in response to the signal which is received from the control unit 21.

When the potentials of the back gates are changed depending on the environmental temperature, first, the internal circuit 23IN applies potentials to the plurality of the wirings BGL1 (the plurality of the wirings BGL2) and then applies correction voltages to the other of the two pairs of the electrodes of the capacitors CF. Thus, the potentials of the plurality of the wirings BGL1 (the plurality of the wirings BGL2) are changed depending on the correction voltages owing to capacitive coupling of the capacitors CF connected to each of them. In this manner, the semiconductor device 11 can correct characteristics of the write transistors in the memory unit 30 depending on the environmental temperature because the semiconductor device 11 has the temperature sensing circuit 25.

Note that one embodiment of the present invention is not limited to the circuit structure described in this embodiment and can be changed as appropriate.

Note that this embodiment can be combined with other embodiments in this specification as appropriate.

Embodiment 2

In this embodiment, a structure example of a memory cell array 40 which constitutes the DOSRAM, the NOSRAM, or the like described in the above embodiment and peripheral circuits thereof is described. Note that in this embodiment, the memory cell array 40 and its peripheral circuits are collectively referred to as a memory device 200.

<Structure Example of Memory Device>

Figure 9:
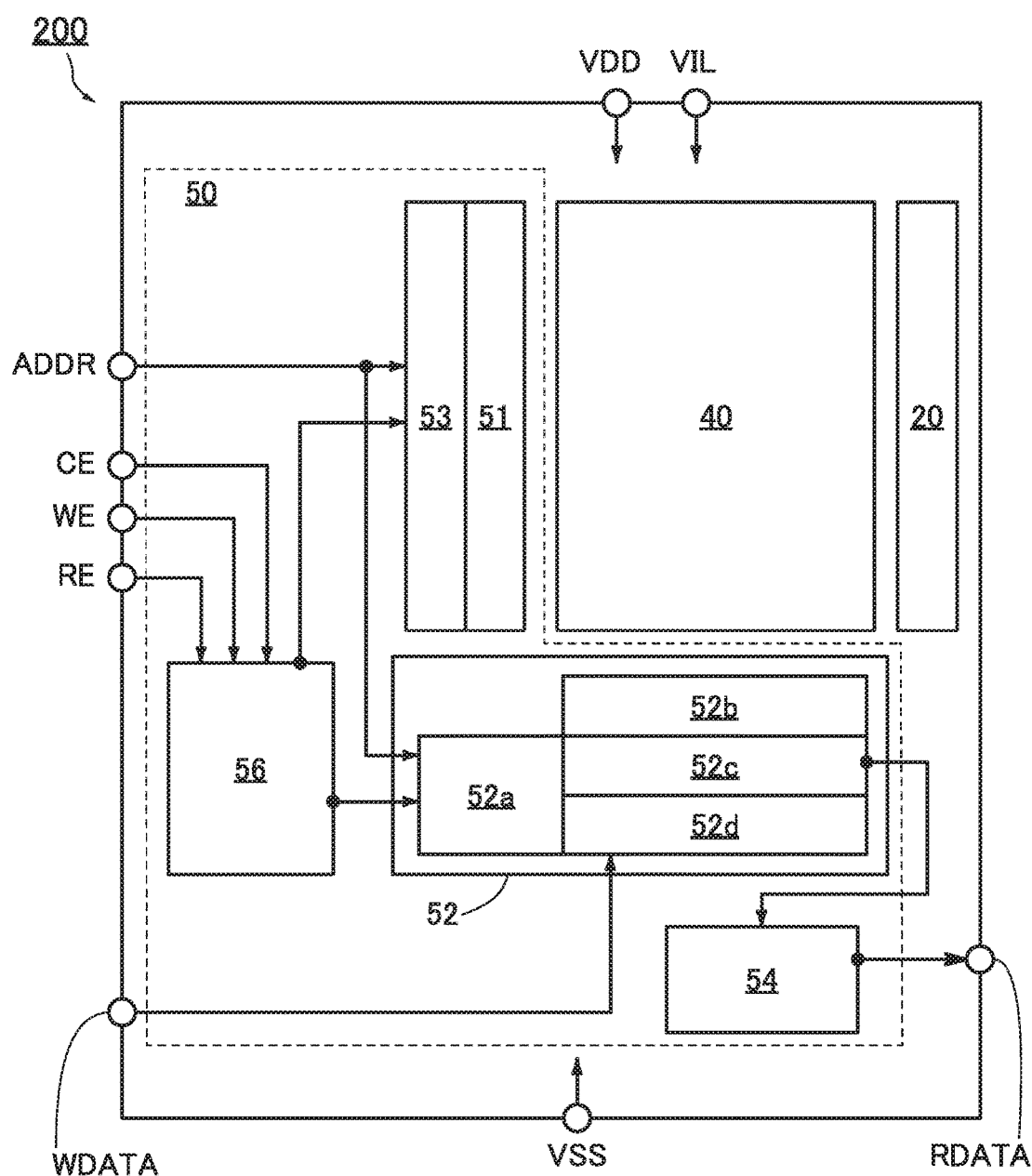
FIG. 9 is a block diagram showing a structure example of a memory device.

FIG. 9 shows a structure example of a memory device. The memory device 200 includes a peripheral circuit 50 and the memory cell array 40. The peripheral circuit 50 includes a row decoder 53, a word line driver circuit 51, a bit line driver circuit 52, an output circuit 54, and a control logic circuit 56. FIG. 9 also shows the control circuit 20 described in Embodiment 1.

The bit line driver circuit 52 includes a column decoder 52a, a precharge circuit 52b, a sense amplifier 52c, and a write circuit 52d. The precharge circuit 52b has a function of precharging a wiring SL, a wiring CAL, a wiring BIL, and the like. The sense amplifier 52c has a function of amplifying a data signal read from the wiring BIL and the wiring RBL. Note that the wiring SL, the wiring CAL, and the wiring RBL are wirings connected to a memory cell included in the cell array 40 and is described later in detail. The amplified data signal is output to the outside of the memory device 200 as a digital data signal RDATA through the output circuit 54.

As power supply voltages from the outside, a low power supply voltage (VSS), a high power supply voltage (VDD) for the peripheral circuit 50, and a high power supply voltage (VIL) for the memory cell array 40 are supplied to the memory device 200.

Control signals (CE, WE, RE), an address signal ADDR, and a data signal WDATA are input to the memory device 200 from the outside. The address signal ADDR is input to the row decoder 53 and the column decoder 52a, and WDATA is input to the write circuit 52d.

The control logic circuit 56 processes the input signals (CE, WE, RE) from the outside, and generates control signals for the row decoder 53 and the column decoder 52a. CE denotes a chip enable signal, WE denotes a write enable signal, and RE denotes a read enable signal. Signals processed by the control logic circuit 56 are not limited to the above, and other control signals may be input as necessary.

Note that whether each circuit or each signal described above is provided or not can be appropriately determined as needed.

Not only the memory cell array 40 but also the peripheral circuit 50 preferably include an OS transistor. Thus, the peripheral circuit 50 and the memory cell array 40 can be fabricated through the same manufacturing process, whereby manufacturing cost of the memory device 200 can be reduced.

<Structure Example of Memory Cell Array>

Figure 10:
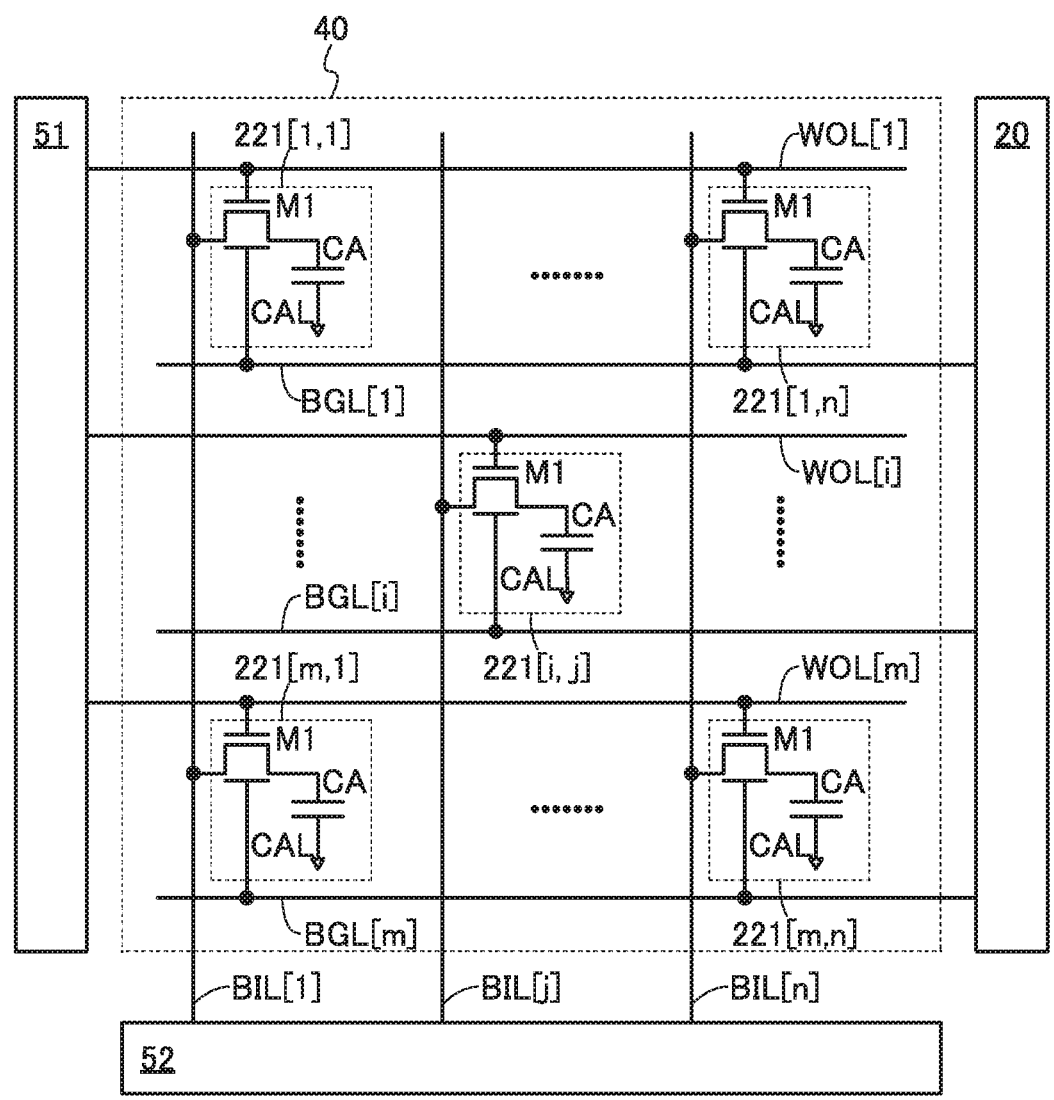
FIG. 10 is a block diagram showing a structure example of a memory cell array included in a memory device.

FIG. 10 shows details of the memory cell array 40 in the case where a DOSRAM is used as a memory cell. The memory cell array 40 includes a total of m×n memory cells 221 of m cells (m is an integer of 1 or more) in one column and n cells (n is an integer of 1 or more) in one row, and the memory cells 221 are arranged in a matrix. FIG. 10 also shows addresses of the memory cells 221 and shows memory cells 221 positioned at addresses of [1,1], [m,1], [i,j], [1,n], and [m,n] (i is an integer of 1 to m, and j is an integer of 1 to n). Note that with the structure of the memory cell 221, the number of the wirings WOL which connect the memory cell array 40 to the word line driver circuit 51 is m (in FIG. 10, only the wiring WOL[1], the wiring WOL[i], and the wiring WOL[m] are shown), and the number of the wirings BGL which connect the memory cell array 40 to the control circuit 20 is also m (in FIG. 10, only the wiring BGL[1], the wiring BGL[i], and the wiring BGL[m] are shown). Furthermore, the number of the wirings BIL which connect the memory cell array 40 to the bit line driver circuit 52 is n (in FIG. 10, only the wiring BIL[1], the wiring BIL[j], and the wiring BIL[n] are shown).

Figure 11:
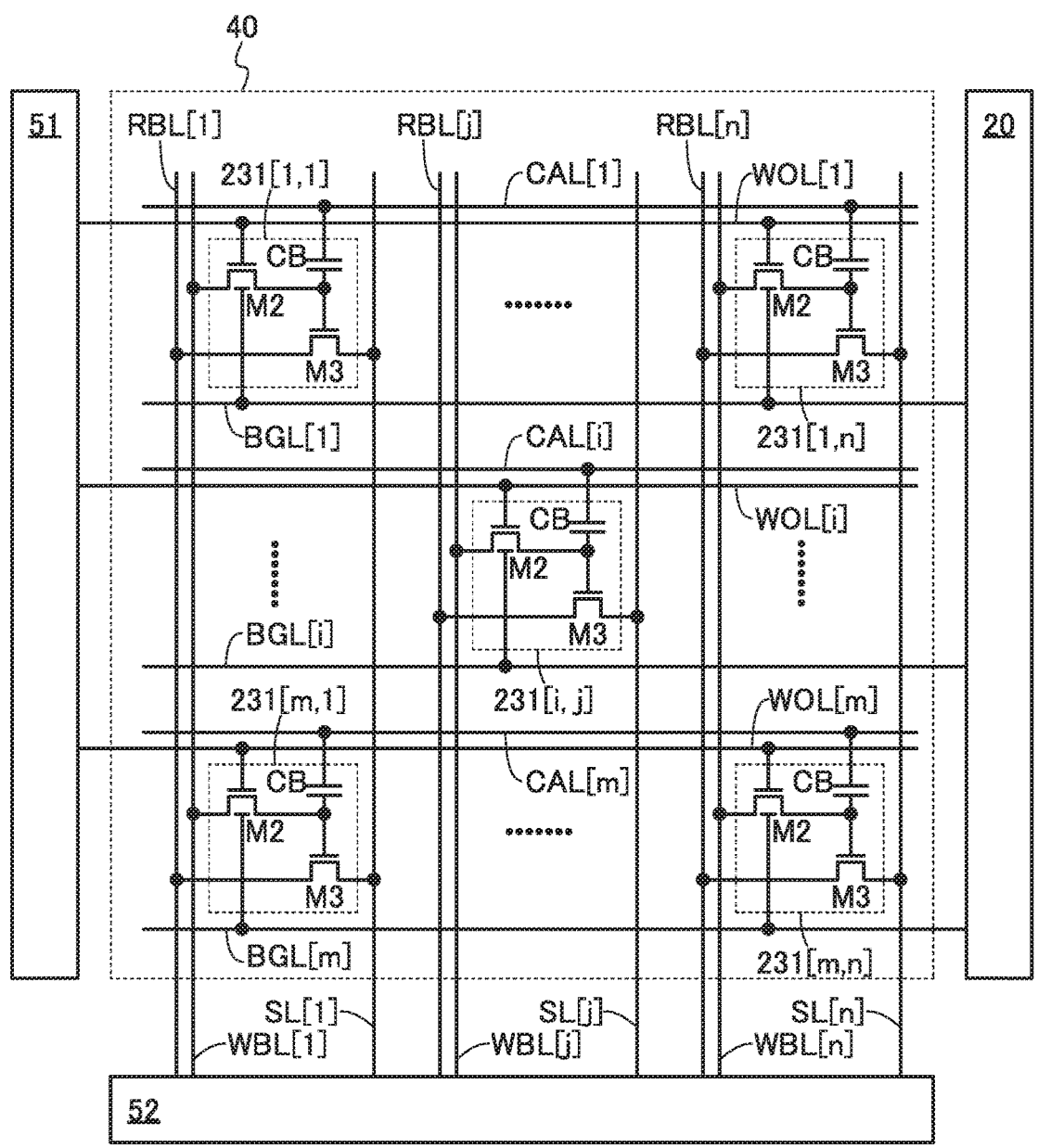
FIG. 11 is a block diagram showing a structure example of a memory cell array included in a memory device.

FIG. 11 shows details of the memory cell array 40 in the case where a NOSRAM is used as a memory cell. The cell array 40 includes a total of m×n memory cells 231 of m cells (m is an integer of 1 or more) in one column and n cells (n is an integer of 1 or more) in one row, and the memory cells 231 are arranged in a matrix. FIG. 11 also shows addresses of the memory cells 231 and shows memory cells 231 positioned at addresses of [1,1], [m,1], [i,j], [1,n], and [m,n] (i is an integer of 1 to m, and j is an integer of 1 to n). Note that with the structure of the memory cell 231, the number of the wirings WOL which connect the memory cell array 40 to the word line driver circuit 51 is m (in FIG. 11, only the wiring WOL[1], the wiring WOL[i], and the wiring WOL[m] are shown), and the number of the wirings BGL which connect the memory cell array 40 to the control circuit 20 is also m (in FIG. 11, only the wiring BGL[1], the wiring BGL[i], and the wiring BGL [m] are shown.). Note that although the number of the wirings CAL is also m (in FIG. 11, only the wiring CAL[1], the wiring CAL[i], and the wiring CAL[m] are shown), the destination which the memory cell 231 is connected to through the wirings CAL is omitted. Furthermore, the number of each of the wirings RBL, the wirings WBL, and the wirings SL which connect the memory cell array 40 to the bit line driver circuit 52 is n (in FIG. 11, only the wiring RBL[1], the wiring RBL[j], the wiring RBL[n], the wiring WBL[1], the wiring WBL[j], the wiring WBL[n], the wiring SL[1], the wiring SL[j], and the wiring SL[n] are shown).

In each of the memory cell array 40 shown in FIG. 10 and FIG. 11, the wiring BGL[1] to the wiring BGL[m] are provided by row; thus, the change of the region in each layer of the memory device described in Embodiment 1 is performed by row. Note that the arrangement of the wirings BGL which are electrically connected to the back gates of the transistors M1 (the transistors M2) in the memory cells 221 (the memory cells 231) in the memory cell array 40 is not limited to that in FIG. 10 and FIG. 11. For example, the wiring BGL may be provided in each of the transistors M1 (the transistors M2) in a plurality of the memory cells 221 (memory cells 231), and the change of the region in each layer of the memory device may be performed in each memory cell 221 (memory cell 231). Alternatively, for example, the memory cells 221 (memory cells 231) in the memory cell array 40 may be divided into regions such as 2×2 or 2×3, and the different wiring BGL may be provided in each region, so that the change of the region in each layer of the memory device is performed.

Figure 12A:
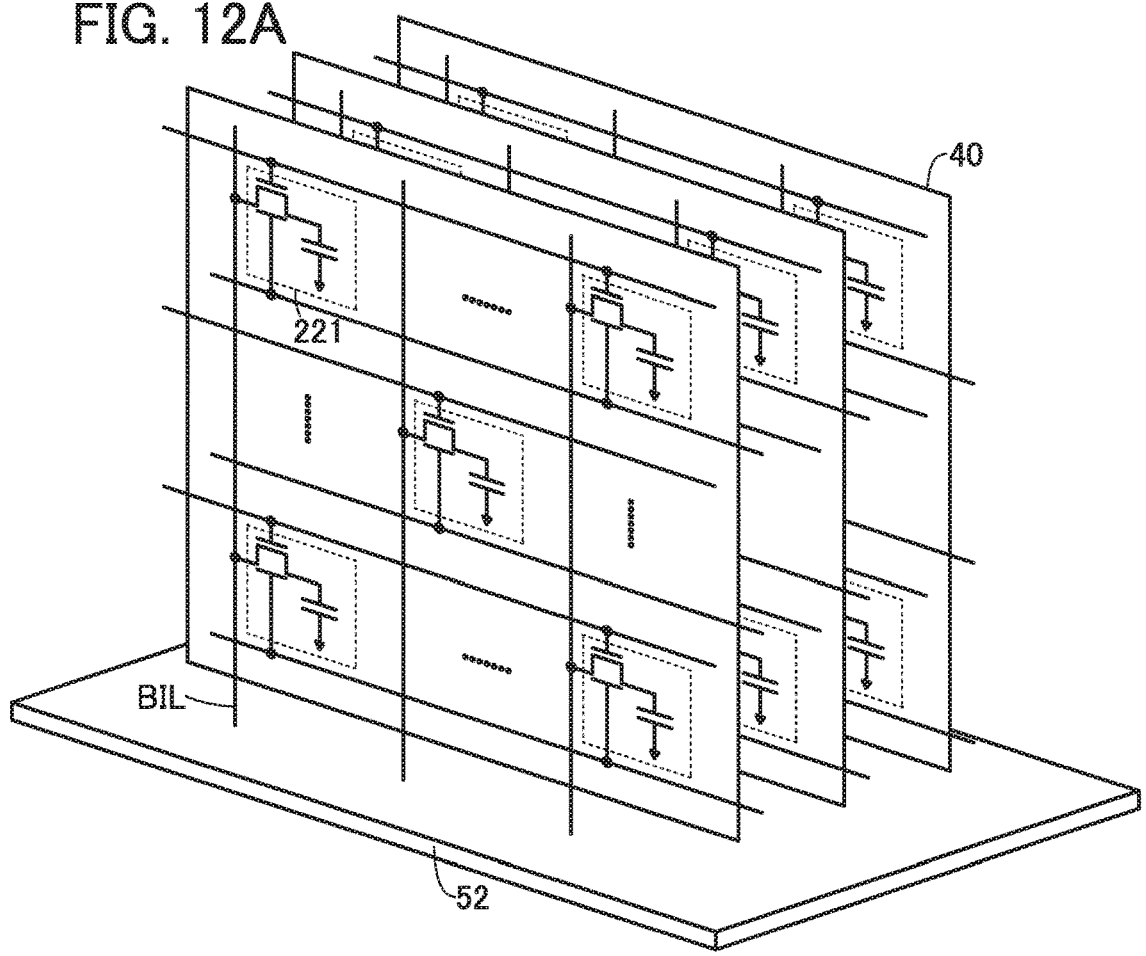
FIGS. 12(A) and 12(B) are diagrams showing a structure example of a memory cell array included in a memory device.
Figure 12B:
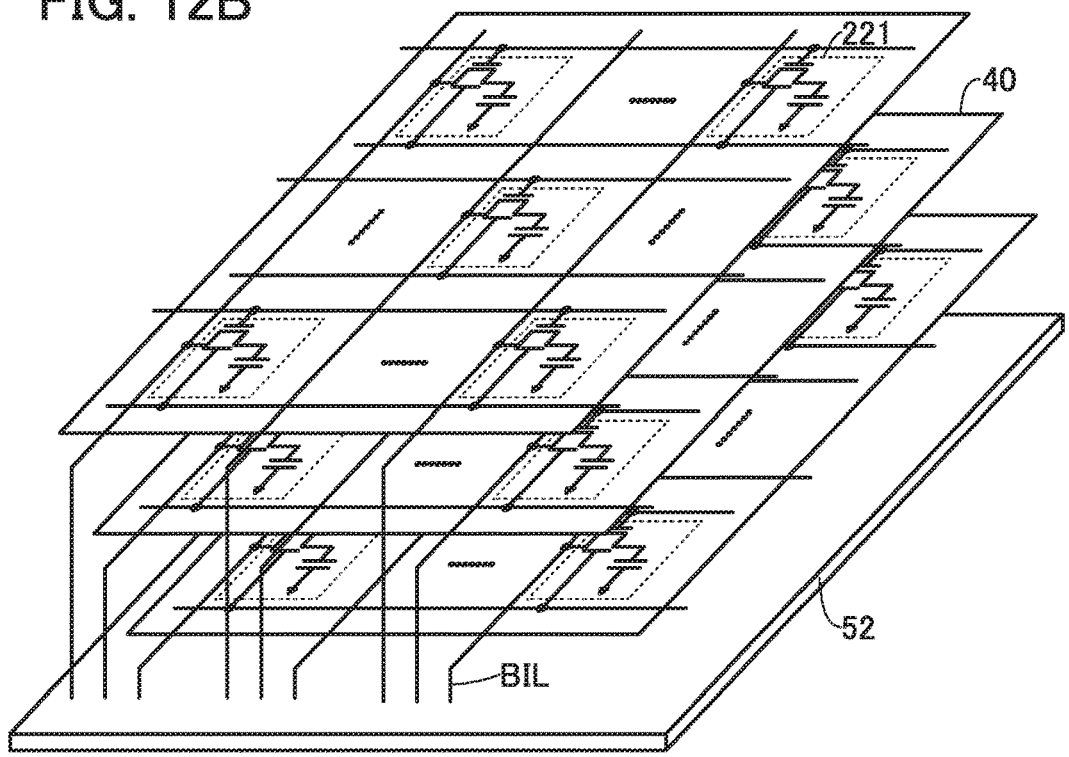

Note that although the memory cells 221 and the memory cells 231 are arranged in a two-dimensional way in each of the memory cell array 40 shown in FIG. 10 and FIG. 11, they may be arranged in a three-dimensional way as shown in FIGS. 12(A) and 12(B). In FIG. 12(A), the wiring BIL provided in the memory cell array 40 is substantially perpendicular to the bit line driver circuit 52. In FIG. 12(B), a plurality of the memory cell arrays 40 and the bit line driver circuit 52 are overlapped with each other. Although the cases in which the memory cells 221 are used are shown in FIGS. 12(A) and 12(B), the memory cells 231 can be arranged in a three-dimensional way, similarly. Although the bit line driver circuit 52 is arranged in a lower layer in FIGS. 12(A) and 12(B), the word line driver circuit 51, the row decoder 53, or a stacked circuit of a plurality of circuits selected from them may be used instead of the bit line driver circuit 52.

The memory device 200 is structured as shown in FIG. 10 and FIG. 11, whereby the circuit area can be small and the memory capacity can be large.

Figure 13:
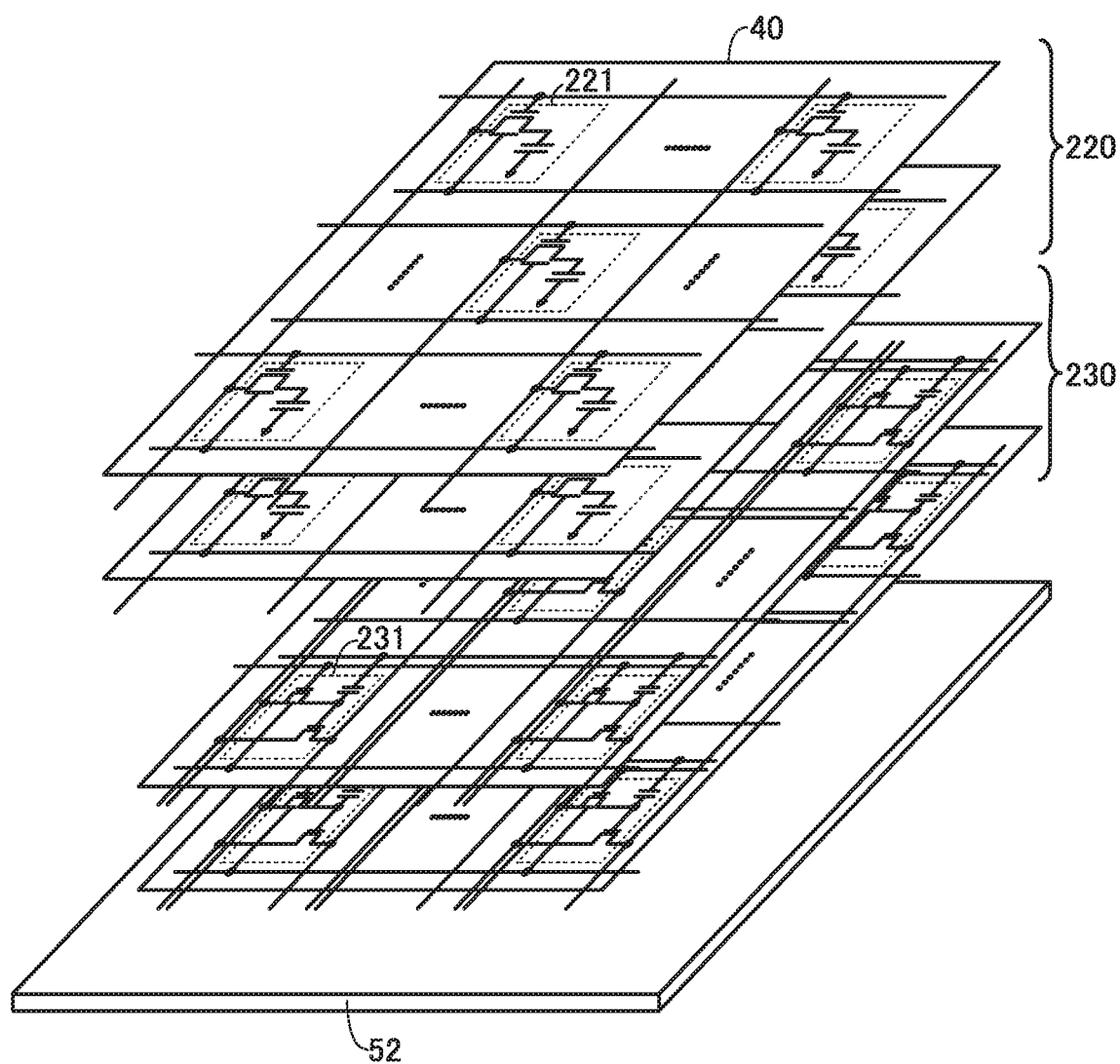
FIG. 13 is a diagram showing a structure example of a memory cell array included in a memory device.

Furthermore, although a structure including the plurality of the memory cell arrays 40 in FIG. 10 is shown in FIGS. 12(A) and 12(B), a structure in which the memory cell arrays 40 shown in FIG. 10 and FIG. 11 are overlapped with each other may be used as shown in FIG. 13. In other words, the memory device 200 may have a structure in which a DOSRAM and a NOSRAM are overlapped with each other, that is, a structure in which the memory circuit 220 and the memory circuit 230 are overlapped with each other. Note that in FIG. 13, the electrical connection between each memory cell array 40 and the bit line driver circuit 52 is omitted to show clearly the overlapping structure. Although the bit line driver circuit 52 is arranged in a lower layer in FIG. 13, the word line driver circuit 51, the row decoder 53, or a stacked circuit of a plurality of circuits selected from them may be used instead of the bit line driver circuit 52. In particular, by providing a circuit such as a voltage generation circuit in a lower layer or a precharge circuit, the memory circuit 220 and the memory circuit 230 can share the circuit in their operations.

Note that one embodiment of the present invention is not limited to the circuit structure described in this embodiment and can be changed as appropriate. For example, although the memory cell 221 and the memory cell 231 are used in the memory cell array 40 in this embodiment, another memory cell may be used.

Note that this embodiment can be combined with other embodiments in this specification as appropriate.

Embodiment 3

In this embodiment, a structure example of an OS transistor that can be used for the semiconductor device described in the above embodiment is described.

<Structure Example of Semiconductor Device>

Figure 14:
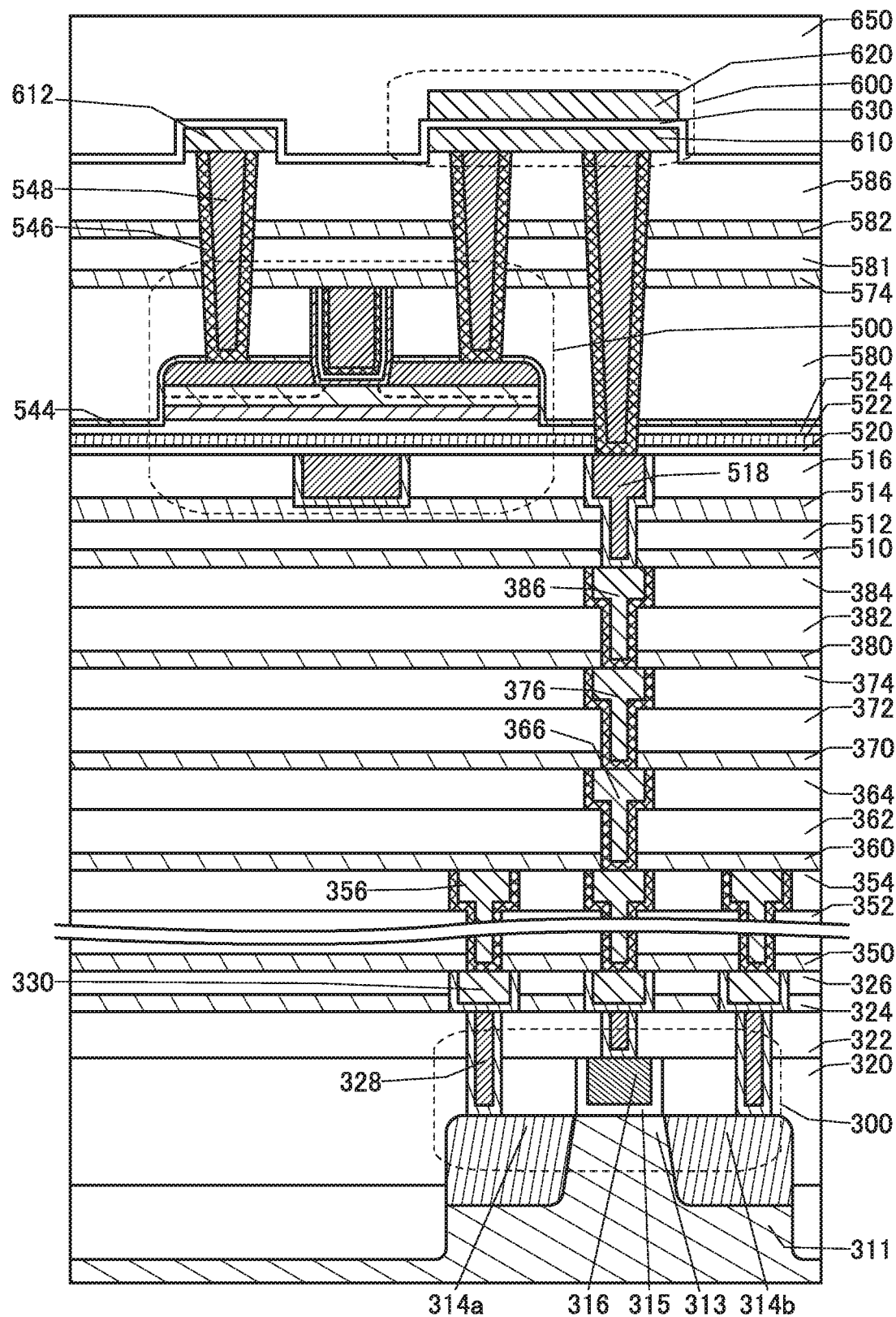
FIG. 14 is a cross-sectional view showing a structure example of a semiconductor device.
Figure 15A:
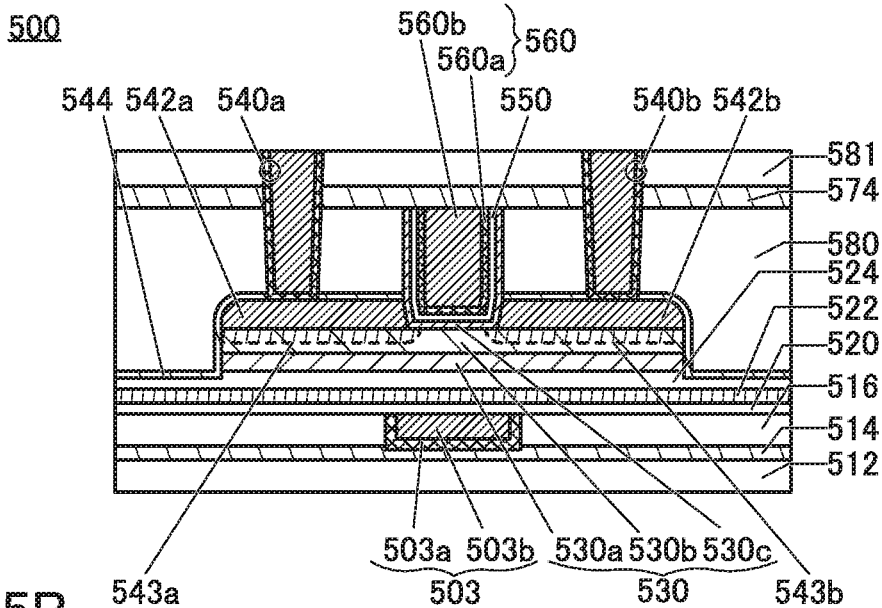
FIGS. 15(A), 15(B), and 15(C) are cross-sectional views showing structure examples of transistors.
Figure 15B:
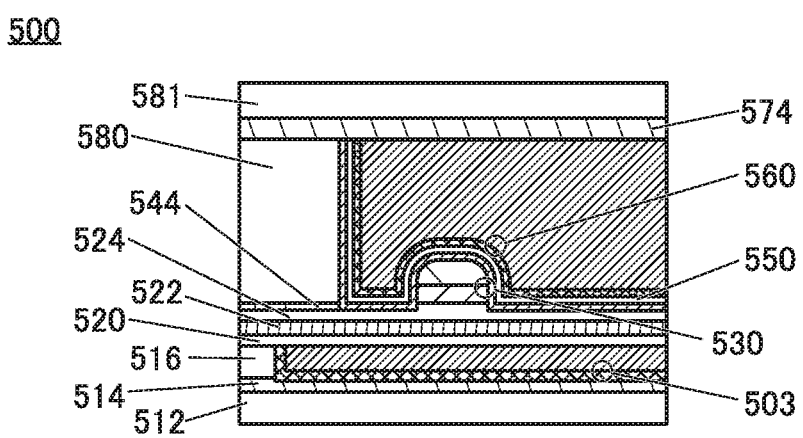
Figure 15C:
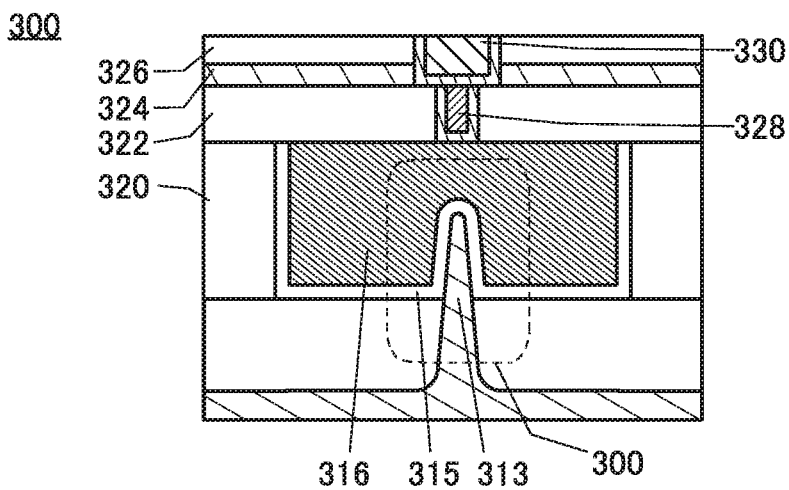

A semiconductor device shown in FIG. 14 includes a transistor 300, a transistor 500, and a capacitor 600. FIG. 15(A) is a cross-sectional view of the transistor 500 in the channel length direction, FIG. 15(B) is a cross-sectional view of the transistor 500 in the channel width direction, and FIG. 15(C) is a cross-sectional view of the transistor 300 in the channel width direction.

The transistor 500 is a transistor containing a metal oxide in a channel formation region (OS transistor). Since the off-state current of the transistor 500 is extremely low, when the transistor 500 is used for the semiconductor device, especially for the transistor M2 in the memory cell 231, first data can be held for a long time. In other words, the frequency of refresh operation is low or refresh operation is not required; thus, power consumption of the semiconductor device can be reduced.

The transistor 500 is provided over the transistor 300, and the capacitor 600 is provided over the transistor 300 and the transistor 500. Note that the capacitor CB in the memory cell 231 can be used as the capacitor 600.

The transistor 300 is provided over a substrate 311 and includes a conductor 316, an insulator 315, a semiconductor region 313 that is part of the substrate 311, and a low-resistance region 314*a* and a low-resistance region 314*b* each functioning as a source region or a drain region. Note that the transistor 300 can be used as the transistors M3 in the above embodiment, for example.

As shown in FIG. 15(C), in the transistor 300, a top surface and a side surface in the channel width direction of the semiconductor region 313 are covered with the conductor 316 with the insulator 315 therebetween. The effective channel width is increased by using the transistor 300 of a Fin-type, whereby the on-state characteristics of the transistor 300 can be improved. In addition, since contribution of an electric field of the gate electrode can be increased, the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314*a* and the low-resistance region 314*b* functioning as a source region and a drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on a material of the conductor, threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 14 is an example and the structure is not limited thereto; an appropriate transistor is used in accordance with a circuit configuration or a driving method. For example, the transistor 300 may have a structure similar to that of the transistor 500 using an oxide semiconductor (not shown). Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for reducing a level difference caused by the transistor 300 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. A plurality of conductors functioning as plugs or wirings are collectively denoted by the same reference numeral in some cases. Furthermore, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 14, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that the diffusion of hydrogen from the transistor 300 into the transistor 500 can be inhibited.

Note that for the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is kept. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 14, an insulator 360, an insulator 362, and an insulator 364 are stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is preferably formed in an opening portion of the insulator 360 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 364 and the conductor 366. For example, in FIG. 14, an insulator 370, an insulator 372, and an insulator 374 are stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is preferably formed in an opening portion of the insulator 370 having a barrier property against hydrogen. With this structure, the transistor 300 and the transistor 500 can be separated by a barrier layer, so that the diffusion of hydrogen from the transistor 300 into the transistor 500 can be inhibited.

A wiring layer may be provided over the insulator 374 and the conductor 376. For example, in FIG. 14, an insulator 380, an insulator 382, and an insulator 384 are stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is preferably formed in an opening portion of the insulator 380 having a barrier property against hydrogen. With this structure, the transistor 300 and the transistor 500 can be separated by a barrier layer, so that the diffusion of hydrogen from the transistor 300 into the Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for one of the insulator 510, the insulator 512, the insulator 514, and the insulator 516.

For example, the insulator 510 and the insulator 514 are preferably formed using a film having a barrier property that prevents diffusion of hydrogen or impurities from the substrate 311, the region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, the diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has an excellent blocking effect that prevents the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low dielectric constant is used for these insulators, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503 for example), and the like are embedded in the insulator 510, the insulator 512, the insulator 514, and the insulator 516. Note that the conductor 518 functions as a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As shown in FIGS. 15(A) and 15(B), the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and includes an opening overlapping with a region between the conductor 542a and the conductor 542b; an oxide 530c positioned on a bottom and a side surface of the opening; an insulator 550 positioned on a formation surface of the oxide 530c; and a conductor 560 positioned on a formation surface of the insulator 550.

Furthermore, as shown in FIGS. 15(A) and 15(B), an insulator 544 is preferably positioned between the insulator 580 and the oxide 530a, the oxide 530b, the conductor 542a, and the conductor 542b. In addition, as shown in FIGS. 15(A) and 15(B), the conductor 560 preferably includes a conductor 560a provided inside the insulator 550 and a conductor 560b embedded inside the conductor 560a. Moreover, as shown in FIGS. 15(A) and 15(B), an insulator 574 is preferably positioned over the insulator 580, the conductor 560, and the insulator 550.

Hereinafter, the oxide 530a, the oxide 530b, and the oxide 530c may be collectively referred to as an oxide 530.

The transistor 500 has a structure in which three layers of the oxide 530a, the oxide 530b, and the oxide 530c are stacked in the region where the channel is formed and its vicinity; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be provided. Although the conductor 560 is shown to have a stacked-layer structure of two layers in the transistor 500, the present invention is not limited thereto. For example, the conductor 560 may have a single-layer structure or a stacked-layer structure of three or more layers. Note that the transistor 500 shown in FIG. 14 and FIGS. 15(A) and 15(B) is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the transistor 500 can have improved switching speed and excellent frequency characteristics.

The conductor 560 sometimes functions as a first gate (also referred to as top gate) electrode. The conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped with by the oxide 530 and the conductor 560. Thus, when potentials are applied to the conductor 560 and the conductor 503, an electric field generated by the conductor 560 and an electric field generated by the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

In the case where the insulator 524 includes an excess-oxygen region, it is preferred that the insulator 522 have a function of inhibiting diffusion of oxygen (e.g., an oxygen atom, an oxygen molecule, or the like) (the oxygen is less likely to pass).

When the insulator 522 has a function of inhibiting diffusion of oxygen or impurities, oxygen contained in the oxide 530 is not diffused to the insulator 520 side, which is preferable. Furthermore, the conductor 503 can be prevented from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. With miniaturization and high integration of transistors, a problem such as leakage current may arise because of a thinner gate insulating film. When a high-k material is used for an insulator functioning as the gate insulating film, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are suitable. Furthermore, when an insulator which is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS each of which is described in Embodiment 4. Furthermore, as the oxide 530, an In—Ga oxide or an In—Zn oxide may be used.

The metal oxide functioning as the channel formation region in the oxide 530 has a band gap of preferably 2 eV or higher, further preferably 2.5 eV or higher. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic proportion of the element M in constituent elements in the metal oxide used as the oxide 530a is preferably greater than the atomic proportion of the element M in constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a. A metal oxide that can be used for the oxide 530a or the oxide 530b can be used for the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at an interface between the oxide 530a and the oxide 530b and an interface between the oxide 530b and the oxide 530c is preferably made low.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b which function as a source electrode and a drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As shown in FIG. 15(A), a region 543a and a region 543b are sometimes formed as a low-resistance region at and in the vicinity of the interface between the oxide 530 and the conductor 542a (the conductor 542b). In that case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. Like the insulator 524 described above, the insulator 550 is preferably formed using an insulator that contains oxygen excessively and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator from which oxygen is released by heating is provided as the insulator 550 in contact with the top surface of the oxide 530c, oxygen can be efficiently supplied from the insulator 550 to the channel formation region of the oxide 530b through the oxide 530c. Furthermore, as in the insulator 524, the concentration of impurities such as water and hydrogen in the insulator 550 is preferably reduced. The thickness of the insulator 550 is preferably greater than or equal to 1 nm and less than or equal to 20 nm.

To efficiently supply excess oxygen in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidization of the conductor 560 due to excess oxygen can be inhibited. For the metal oxide, a material that can be used for the insulator 544 is used.

Although the conductor 560 functioning as the first gate electrode has a two-layer structure in FIGS. 15(A) and 15(B), a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting oxygen diffusion, it is possible to prevent a reduction in conductivity of the conductor 560b due to oxidation caused by oxygen contained in the insulator 550. As a conductive material having a function of inhibiting diffusion of oxygen, for example, tantalum, tantalum nitride, ruthenium, or ruthenium oxide is preferably used.

The conductor 560b is preferably formed using a conductive material containing tungsten, copper, or aluminum as its main component. The conductor 560b also functions as a wiring and thus is preferably formed using a conductor having high conductivity. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide, in which an excess-oxygen region can be easily formed in a later step, are preferable.

When the insulator 580 which contains an excess oxygen region and releases oxygen by heating is provided in contact with the oxide 530c, oxygen in the insulator 580 can be efficiently supplied to the oxide 530a and the oxide 530b through the oxide 530c. Note that the concentration of impurities such as water and hydrogen in the insulator 580 is preferably lowered.

The opening of the insulator 580 is formed to overlap with a region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; hence, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that is described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low dielectric constant is used for the insulators, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

In addition, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

As the conductor 612 and the conductor 610, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each of which has a single-layer structure are shown in FIG. 14, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

<Transistor Structure Examples>

Note that the structure of the transistor 500 in the semiconductor device described in this embodiment is not limited to the above. Examples of structures that can be used for the transistor 500 is described below. Note that transistors described below are variation examples of the above transistor; therefore, differences from the above transistor are mainly described below and the description of portions identical to the above is sometimes omitted.

<Transistor Structure Example 1>

Figure 16A:
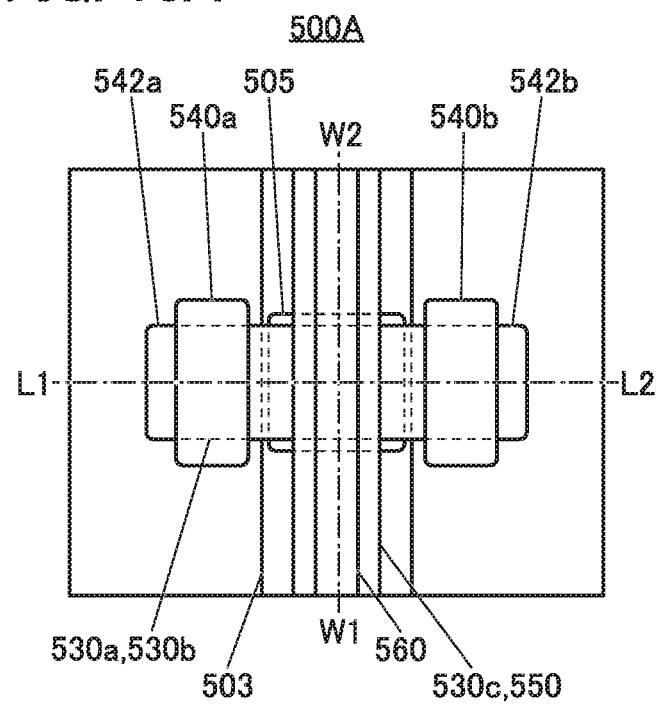
FIG. 16(A) is a top view showing a structure example of a transistor and FIGS. 16(B) and 16(C) are cross-sectional views showing the structure example of the transistor.
Figure 16C:
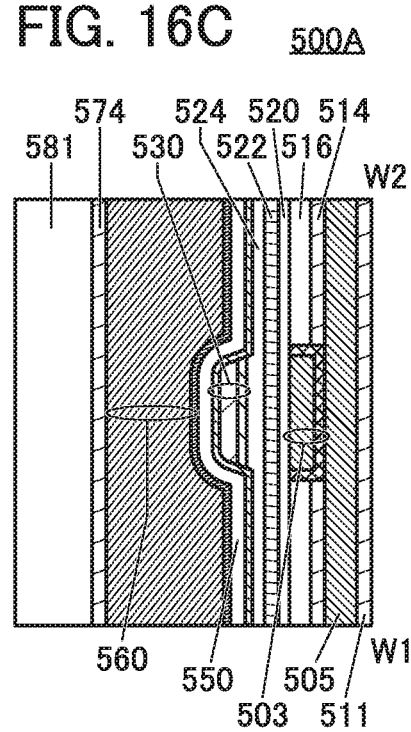
Figure 16B:
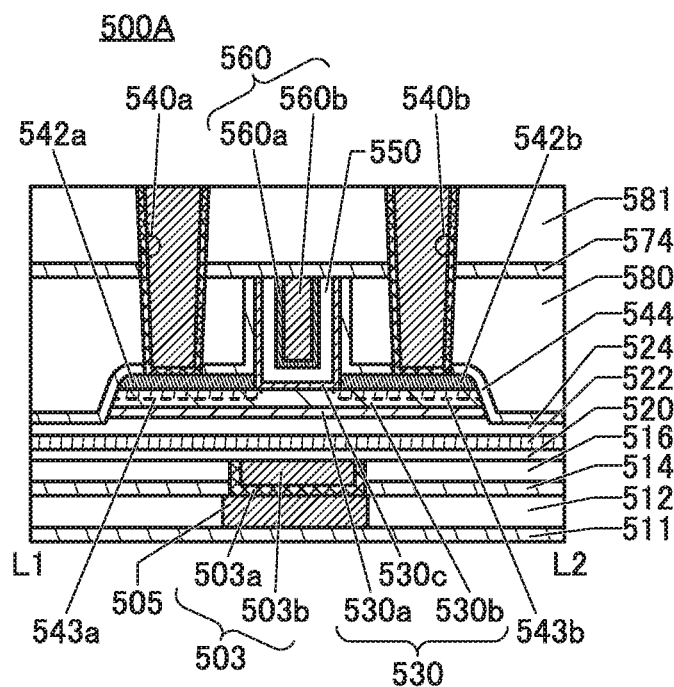

A structure example of the transistor 500A is described with reference to FIGS. 16(A), 16(B), and 16(C). FIG. 16(A) is a top view of the transistor 500A. FIG. 16(B) is a cross-sectional view of a portion indicated by a dashed-dotted line L1-L2 in FIG. 16(A). FIG. 16(C) is a cross-sectional view of a portion indicated by a dashed-dotted line W1-W2 in FIG. 16(A). For clarity of the drawing, some components are not shown in the top view of FIG. 16(A).

FIGS. 16(A), 16(B), and 16(C) show the transistor 500A and an insulator 511, the insulator 512, the insulator 514, the insulator 516, the insulator 580, the insulator 574, and the insulator 581 that function as interlayer films. FIGS. 16(A), 16(B), and 16(C) show the conductor 540a, the conductor 540b, and a conductor 505 that are electrically connected to the transistor 500A. In particular, the conductor 540a and the conductor 540b function as contact plugs, and the conductor 505 functions as a wiring.

The transistor 500A includes the conductor 560 (the conductor 560a and the conductor 560b) functioning as a first gate electrode; a conductor 503 (a conductor 503a and a conductor 503b) functioning as a second gate electrode; the insulator 550 functioning as a first gate insulating film; an insulator 520, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 544.

In the transistor 500A shown in FIGS. 16(A), 16(B), and 16(C), the oxide 530c, the insulator 550, and the conductor 560 are positioned in an opening provided in the insulator 580 with the insulator 544 positioned therebetween. Moreover, the oxide 530c, the insulator 550, and the conductor 560 are positioned between the conductor 542a and the conductor 542b.

The insulator 511 and the insulator 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 500A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass). Moreover, aluminum oxide or silicon nitride, for example, may be used for the insulator 511. This structure can inhibit diffusion of impurities such as hydrogen and water to the transistor 500A side from the substrate side of the insulator 511.

For example, the dielectric constant of the insulator 512 is preferably lower than that of the insulator 511. When a material with a low dielectric constant is used for an interlayer film, parasitic capacitance generated between wirings can be reduced.

The conductor 505 is formed to be embedded in the insulator 512. Here, the level of the top surface of the conductor 505 and the level of the top surface of the insulator 512 can be substantially the same. Note that although the conductor 505 with a single layer structure is shown, the present invention is not limited thereto. For example, the conductor 505 may have a multilayer structure of two or more layers. Note that for the conductor 505, a conductive material that has high conductivity and contains tungsten, copper, or aluminum as its main component is preferably used.

In the transistor 500A, the conductor 560 sometimes functions as a first gate (also referred to as a top gate) electrode. The conductor 503 sometimes functions as a second gate (also referred to as a bottom gate) electrode. In that case, the threshold voltage of the transistor 500A can be controlled by changing a potential applied to the conductor 503 independently of a potential applied to the conductor 560. In particular, the threshold voltage of the transistor 500A can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

For example, when the conductor 503 and the conductor 560 overlap with each other, in the case where a potential is applied to the conductor 560 and the conductor 503, an electric field generated from the conductor 560 and an electric field generated from the conductor 503 are connected and can cover a channel formation region formed in the oxide 530.

That is, the channel formation region can be electrically surrounded by the electric field of the conductor 560 having a function of the first gate electrode and the electric field of the conductor 503 having a function of the second gate electrode. In this specification, a transistor structure in which a channel formation region is electrically surrounded by electric fields of a first gate electrode and a second gate electrode is referred to as a surrounded channel (S-channel) structure.

Like the insulator 511 or the insulator 512, the insulator 514 and the insulator 516 function as interlayer films. For example, the insulator 514 preferably functions as a barrier film that inhibits entry of impurities such as water or hydrogen into the transistor 500A from the substrate side. This structure can inhibit diffusion of impurities such as hydrogen and water to the transistor 500A side from the substrate side of the insulator 514. Moreover, for example, the insulator 516 preferably has a lower dielectric constant than the insulator 514. When a material with a low dielectric constant is used for an interlayer film, parasitic capacitance generated between wirings can be reduced In the conductor 503 functioning as the second gate, the conductor 503a is formed in contact with an inner wall of an opening in the insulator 514 and the insulator 516, and the conductor 503b is formed further inside. Here, the top surfaces of the conductor 503a and the conductor 503b and the top surface of the insulator 516 can be substantially level with each other. Although the transistor 500A having a structure in which the conductor 503a and the conductor 503b are stacked is shown, the present invention is not limited thereto. For example, the conductor 503 may have a single-layer structure or a stacked-layer structure of three or more layers.

Here, for the conductor 503a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (the above oxygen is less likely to pass). Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, a reduction in conductivity of the conductor 503b due to oxidation can be inhibited.

In the case where the conductor 503 doubles as a wiring, the conductor 503b is preferably formed using a conductive material that has high conductivity and contains tungsten, copper, or aluminum as its main component. In that case, the conductor 505 is not necessarily provided. Note that the conductor 503b is shown as a single layer but may have a stacked-layer structure, for example, a stack of any of the above conductive materials and titanium or titanium nitride.

The insulator 522 having a function of the second gate insulating film preferably has a barrier property. The insulator 522 having a barrier property functions as a layer that inhibits entry of impurities such as hydrogen into the transistor 500A from the surroundings of the transistor 500A.

Note that the second gate insulating film is shown to have a three-layer stacked structure in FIGS. 16(B) and 16(C), but may have a single-layer structure or a stacked-layer structure of two layers or four or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one kind of metal oxide, can be used.

Note that the oxide 530c is preferably provided in the opening in the insulator 580 with the insulator 544 positioned therebetween. When the insulator 544 has a barrier property, diffusion of impurities from the insulator 580 into the oxide 530 can be inhibited.

The conductor 542a functioning as one of the source electrode and the drain electrode and the conductor 542b functioning as the other of the source electrode and the drain electrode can be formed using a metal such as aluminum, titanium, chromium, nickel, copper, yttrium, zirconium, molybdenum, silver, or tantalum, or an alloy containing any of the metals as its main component. In particular, a metal nitride film of tantalum nitride or the like is preferable because it has a barrier property against hydrogen or oxygen and high oxidation resistance.

Although a single-layer structure is shown in FIG. 16(B), a stacked-layer structure of two or more layers may be employed. For example, it is preferable to stack a tantalum nitride film and a tungsten film. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

In addition, a barrier layer may be provided over the conductor 542a and the conductor 542b. The barrier layer is preferably formed using a material having a barrier property against oxygen or hydrogen. This structure can inhibit oxidation of the conductor 542a and the conductor 542b at the time of deposition of the insulator 544.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

When the above barrier layer is included, the range of choices for the materials of the conductor 542a and the conductor 542b can be expanded. For example, a material having a low oxidation resistance and high conductivity, such as tungsten or aluminum, can be used for the conductor 542a and the conductor 542b. Moreover, for example, a conductor that can be easily deposited or processed can be used.

The insulator 550 functions as a first gate insulating film. The insulator 550 is preferably provided in the opening in the insulator 580 with the oxide 530c and the insulator 544 positioned therebetween.

With miniaturization and high integration of transistors, a problem such as leakage current may arise because of a thinner gate insulating film. In that case, the insulator 550 may have a stacked-layer structure like the second gate insulating film. When the insulating film functioning as the gate insulator has a stacked-layer structure of a high-k material and a thermally stable material, a gate potential during operation of the transistor can be reduced while the physical thickness is maintained. Furthermore, the stacked-layer structure can be thermally stable and have a high dielectric constant.

The conductor 560 functioning as a first gate electrode includes the conductor 560a and the conductor 560b over the conductor 560a. Like the conductor 503a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, for example, tantalum, tantalum nitride, ruthenium, or ruthenium oxide is preferably used. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. The conductor 560 functions as a wiring and thus is preferably formed using a conductor having high conductivity. The conductor 560b may have a stacked-layer structure, for example, a stack of any of the above conductive materials and titanium or titanium nitride.

The insulator 544 is positioned between the insulator 580 and the transistor 500A. For the insulator 544, an insulating material having a function of inhibiting diffusion of oxygen and impurities such as water or hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 574, and the insulator 581 function as interlayer films.

Like the insulator 514, the insulator 574 preferably functions as a barrier insulating film that inhibits entry of impurities such as water or hydrogen into the transistor 500A from the outside.

Like the insulator 516, the insulator 580 and the insulator 581 preferably have a lower dielectric constant than the insulator 574. When a material with a low dielectric constant is used for an interlayer film, parasitic capacitance generated between wirings can be reduced The transistor 500A may be electrically connected to another component through a plug or a wiring such as the conductor 540a and the conductor 540b embedded in the insulator 580, the insulator 574, and the insulator 581.

As a material of the conductor 540a and the conductor 540b, a single layer or a stacked layer of a conductive material such as a metal material, an alloy material, a metal nitride material, or a metal oxide material can be used as in the conductor 503. For example, it is preferable to use a high-melting-point material that has both heat resistance and conductivity, such as tungsten or molybdenum. Alternatively, it is preferable to form the plugs and wirings with a low-resistance conductive material such as aluminum or copper. The use of a low-resistance conductive material can reduce wiring resistance.

For example, the conductor 540*a* and the conductor 540*b* employ a stacked-layer structure of tantalum nitride or the like, which is a conductor having a barrier property against hydrogen and oxygen, and tungsten, which has high conductivity, whereby the diffusion of impurities from the outside can be inhibited while the conductivity of a wiring is kept.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

<Transistor Structure Example 2>

Figure 17A:
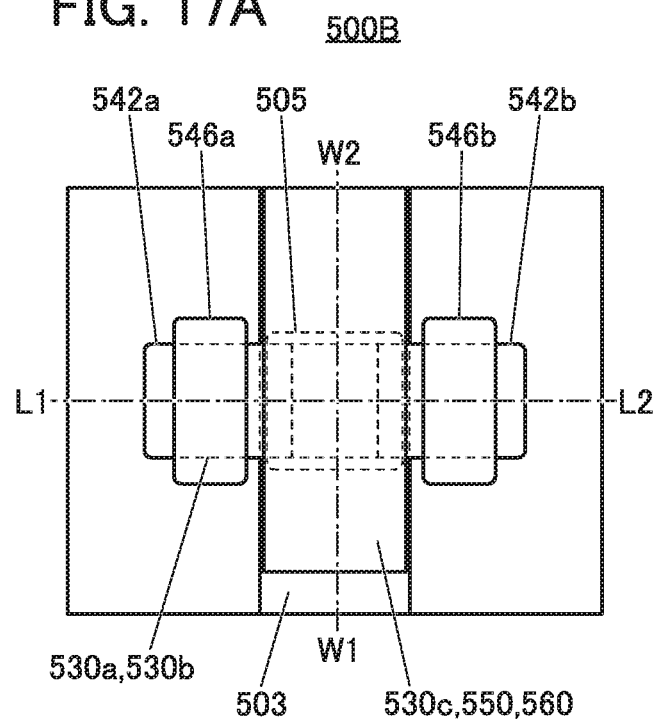
FIG. 17(A) is a top view showing a structure example of a transistor and FIGS. 17(B) and 17(C) are cross-sectional views showing the structure example of the transistor.
Figure 17C:
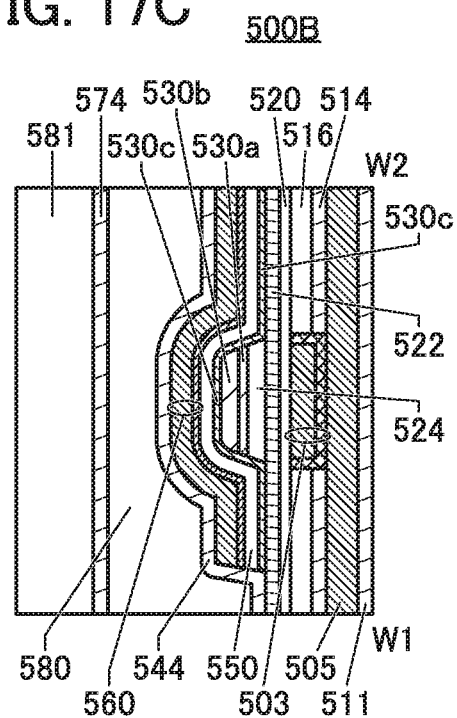
Figure 17B:
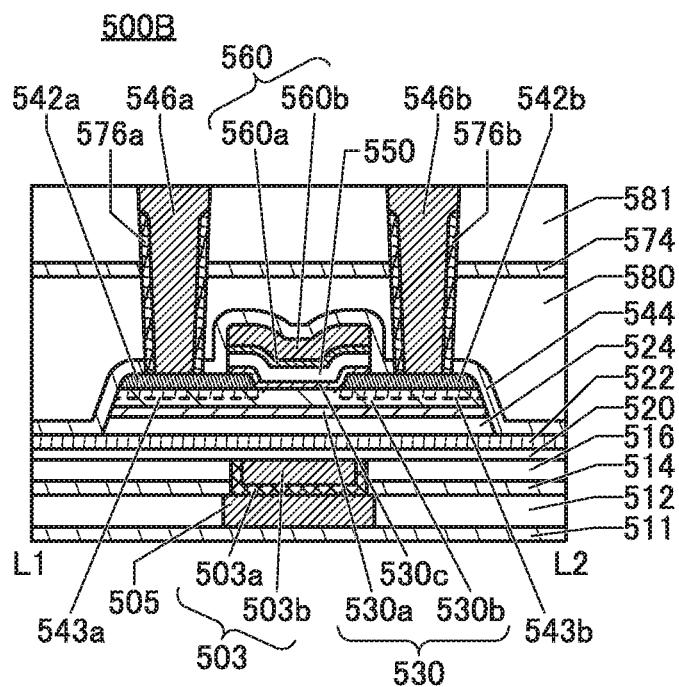

A structure example of a transistor 500B is described with reference to FIGS. 17(A), 17(B), and 17(C). FIG. 17(A) is a top view of the transistor 500B. FIG. 17(B) is a cross-sectional view of a portion indicated by a dashed-dotted line L1-L2 in FIG. 17(A). FIG. 17(C) is a cross-sectional view of a portion indicated by a dashed-dotted line W1-W2 in FIG. 17(A). Note that for clarification of the drawing, some components are not shown in the top view of FIG. 17(A).

The transistor 500B is a variation example of the transistor 500A. Therefore, differences from the transistor 500A are mainly described to avoid repeated description.

The transistor 500B includes a region where the conductor 542*a* (the conductor 542*b*), the oxide 530*c*, the insulator 550, and the conductor 560 overlap with each other. With this structure, a transistor having a high on-state current can be provided. Moreover, a transistor having high controllability can be provided.

The conductor 560 functioning as a first gate electrode includes the conductor 560*a* and the conductor 560*b* over the conductor 560*a*. Like the conductor 503*a*, the conductor 560*a* is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting oxygen diffusion, the range of choices for the material of the conductor 560*b* can be expanded. That is, the conductor 560*a* inhibits oxidation of the conductor 560*b*, thereby preventing the decrease in conductivity.

The insulator 544 is preferably provided to cover a top surface and a side surface of the conductor 560, a side surface of the insulator 550, and a side surface of the oxide 530*c*. For the insulator 544, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit oxidation of the conductor 560. Moreover, the insulator 544 can inhibit diffusion of impurities such as water and hydrogen contained in the insulator 580 into the transistor 500B.

A contact plug of the transistor 500B has a structure different from that of the contact plug of the transistor 500A. In the transistor 500B, an insulator 576*a* (an insulator 576*b*) having a barrier property is provided between the insulator 580 and the conductor 546*a* (the conductor 546*b*) serving as a contact plug. Providing the insulator 576*a* (the insulator 576*b*) can prevent oxygen in the insulator 580 from reacting with the conductor 546 and oxidizing the conductor 546.

Furthermore, by providing the insulator 576*a* (the insulator 576*b*) having a barrier property, the range of choices for the materials of the conductor used for the plug or the wiring can be expanded. The use of a metal material having an oxygen absorbing property and high conductivity for the conductor 546*a* (the conductor 546*b*), for example, can provide a semiconductor device with low power consumption. Specifically, a material having low oxidation resistance and high conductivity, such as tungsten or aluminum, can be used. Moreover, for example, a conductor that can be easily deposited or processed can be used.

<Transistor Structure Example 3>

A structure example of a transistor 500C is described with reference to FIGS. 18(A), 18(B), and 18(C). FIG. 18(A) is a top view of the transistor 500C. FIG. 18(B) is a cross-sectional view of a portion indicated by a dashed-dotted line L1-L2 in FIG. 18(A). FIG. 18(C) is a cross-sectional view of a portion indicated by a dashed-dotted line W1-W2 in FIG. 18(A). Note that for simplification of the drawing, some components are not shown in the top view in FIG. 18(A).

The transistor 500C is a variation example of the transistor 500A. Therefore, differences from the transistor 500A is mainly described to avoid repeated description.

In the transistor 500C shown in FIGS. 18(A), 18(B), and 18(C), a conductor 547*a* is positioned between the conductor 542*a* and the oxide 530*b* and a conductor 547*b* is positioned between the conductor 542*b* and the oxide 530*b*. Here, the conductor 542*a* (the conductor 542*b*) has a region that extends beyond the top surface and a side surface on the conductor 560 side of the conductor 547*a* (the conductor 547*b*) and is in contact with a top surface of the oxide 530*b*. For the conductor 547*a* and the conductor 547*b*, a conductor that can be used for the conductor 542*a* and the conductor 542*b* is used. Furthermore, the conductor 547*a* and the conductor 547*b* are preferably thicker than at least the conductor 542*a* and the conductor 542*b*.

In the transistor 500C shown in FIGS. 18(A), 18(B), and 18(C), because of the above structure, the conductor 542*a* and the conductor 542*b* can be closer to the conductor 560 than in the transistor 500A. Alternatively, the conductor 560 and an end portion of the conductor 542*a* and an end portion of the conductor 542*b* can overlap with each other. Accordingly, the effective channel length of the transistor 500C can be shortened, and the on-state current and the frequency characteristics can be improved.

The conductor 547*a* (the conductor 547*b*) is preferably provided to be overlapped with the conductor 542*a* (the conductor 542*b*). With such a structure, the conductor 547*a* (the conductor 547*b*) can function as a stopper to prevent over-etching of the oxide 530*b* in etching for forming the opening in which the conductor 540*a* (the conductor 540*b*) is to be embedded.

The transistor 500C shown in FIGS. 18(A), 18(B), and 18(C) may have a structure in which an insulator 545 is positioned on and in contact with the insulator 544. The insulator 544 preferably functions as a barrier insulating film that inhibits entry of impurities such as water and hydrogen and excess oxygen into the transistor 500C from the insulator 580 side. For the insulator 545, an insulator that can be used for the insulator 544 can be used. In addition, the insulator 544 may be formed using a nitride insulator such as aluminum nitride, aluminum titanium nitride, titanium nitride, silicon nitride, or silicon nitride oxide, for example.

The transistor 500C in FIGS. 18(A), 18(B), and 18(C) differs from the transistor 500A shown in FIGS. 16(A), 16(B), and 16(C), and may have the conductor 503 with a single-layer structure. In this case, an insulating film to be the insulator 516 is formed over the patterned conductor 503, and an upper portion of the insulating film is removed by a CMP method or the like until a top surface of the conductor 503 is exposed. Preferably, the planarity of the top surface of the conductor 503 is made favorable. For example, the average surface roughness (Ra) of the top surface of the conductor 503 is less than or equal to 1 nm, preferably less than or equal to 0.5 nm, further preferably less than or equal to 0.3 nm. This allows the improvement in planarity of an insulating layer to be formed over the conductor 503 and the increase in crystallinity of the oxide 530$b$ and the oxide 530$c$.

<Transistor Structure Example 4>

A structure example of a transistor 500D is described with reference to FIGS. 19(A), 19(B), and 19(C). FIG. 19(A) is a top view of the transistor 500D. FIG. 19(B) is a cross-sectional view of a portion indicated by a dashed-dotted line L1-L2 in FIG. 19(A). FIG. 19(C) is a cross-sectional view of a portion indicated by a dashed-dotted line W1-W2 in FIG. 19(A). For clarity of the drawing, some components are not shown in the top view of FIG. 19(A).

The transistor 500D has a structure different from those of the transistor 500A, the transistor 500B, and the transistor 500C. Therefore, to avoid repetition of the description, duplicate contents with the transistor 500A, the transistor 500B, and the transistor 500C are mainly omitted and different points are mainly described.

Like the transistor 500C shown in FIGS. 18(A), 18(B), and 18(C), the transistor 500D shown in FIGS. 19(A) to 19(C) is not provided with the conductor 505 and makes the conductor 503 serve as both a second gate and a wiring. Furthermore, the insulator 550 is provided over the oxide 530$c$ and a metal oxide 552 is provided over the insulator 550. The transistor 500D further includes the conductor 560 over the metal oxide 552 and an insulator 570 over the conductor 560. Moreover, the transistor 500D includes an insulator 571 over the insulator 570.

Thus, the metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidization of the conductor 560 due to oxygen can be suppressed.

Note that the metal oxide 552 may function as part of the first gate. For the metal oxide 552, the oxide semiconductor that can be used as the oxide 530 can be used, for example. In this case, when the conductor 560 is deposited by a sputtering method, the metal oxide 552 can have a reduced electric resistance to be a conductive layer. This can be referred to as an OC (Oxide Conductor) electrode.

Note that the metal oxide 552 has a function of part of the gate insulating film in some cases. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of an insulating layer functioning as the gate insulating film can be reduced.

Although the metal oxide 552 in the transistor 500D is shown as a single layer, the metal oxide 552 may have a stacked-layer structure of two or more layers. For example, a metal oxide functioning as part of a gate electrode and a metal oxide functioning as part of a gate insulating film may be stacked.

With the metal oxide 552 functioning as a gate electrode, the on-state current of the transistor 500D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential structure. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidization of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a surface of the substrate can be greater than or equal to 75° and less than or equal to 100°, preferably greater than or equal to 80° and less than or equal to 95°.

An insulating material having a function of inhibiting passage of oxygen and impurities such as water and hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530$c$ are selectively removed using the insulator 571 as a hard mask, whereby their side surfaces can be substantially aligned with each other and a surface of the oxide 530$b$ can be partly exposed.

In the transistor 500D, part of the exposed surface of the oxide 530b includes a region 531a and a region 531b. One of the region 531a and the region 531b functions as a source region, and the other functions as a drain region.

The region 531a and the region 531b can be formed by, for example, introducing an impurity element such as phosphorus or boron to the exposed surface of the oxide 530b by an ion implantation method, an ion doping method, a plasma immersion ion implantation method, plasma treatment, or the like. In this embodiment and the like, an "impurity element" refers to an element other than main constituent elements.

The region 531a and the region 531b can also be formed in the following manner: a metal film is deposited after part of the surface of the oxide 530b is exposed and then the element in the metal film is diffused into the oxide 530b by heat treatment.

The regions of the oxide 530b into which the impurity element is introduced have decreased electric resistivity. Accordingly, the region 531a and the region 531b are each referred to as an impurity region or a low-resistance region in some cases.

The region 531a and the region 531b can be formed in a self-aligned manner by using the insulator 571 and/or the conductor 560 as a mask. Accordingly, the conductor 560 does not overlap with the region 531a and/or the region 531b, so that the parasitic capacitance can be reduced. Furthermore, an offset region is not formed between the channel formation region and the source or drain region (the region 531a or the region 531b). The formation of the region 531a and the region 531b in a self-aligned manner achieves an increase in the on-state current, a reduction in the threshold voltage, and an improvement in the operation frequency, for example.

In order to further reduce the off-state current, the offset region may be provided between the channel formation region and the source or drain region. The offset region is a region where the electrical resistivity is high and a region where the above-described addition of the impurity element is not performed. The offset region can be formed by the above-described addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 500D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 500D also includes the insulator 544 over the insulator 575 and the oxide 530. The insulator 544 is preferably deposited by a sputtering method. When a sputtering method is used, an insulator containing few impurities such as water or hydrogen can be deposited. For example, aluminum oxide is preferably used for the insulator 544.

Note that an oxide film formed by a sputtering method may extract hydrogen from the structure body over which the oxide film is deposited. Thus, the hydrogen concentration in the oxide 530 and the insulator 575 can be reduced when the insulator 544 absorbs hydrogen and water from the oxide 530 and the insulator 575.

<Transistor Structure Example 5>

Figure 20A:
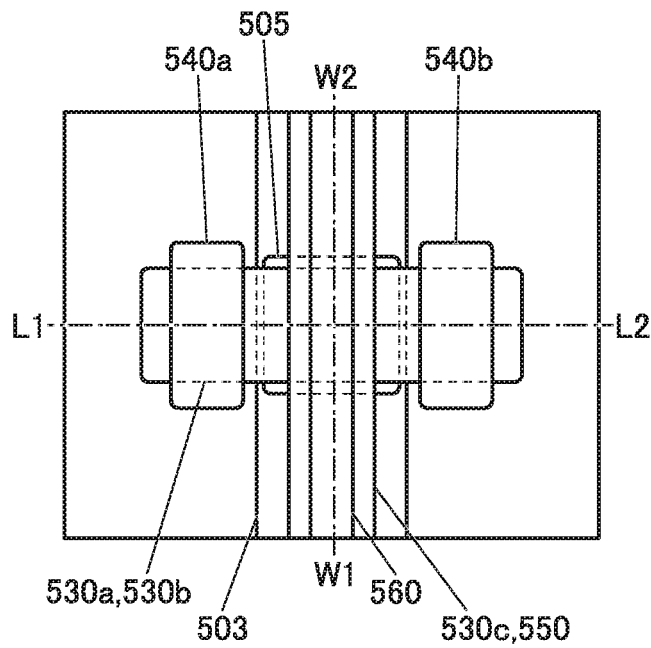
FIG. 20(A) is a top view showing a structure example of a transistor and FIGS. 20(B) and 20(C) are cross-sectional views showing the structure example of the transistor.
Figure 20C:
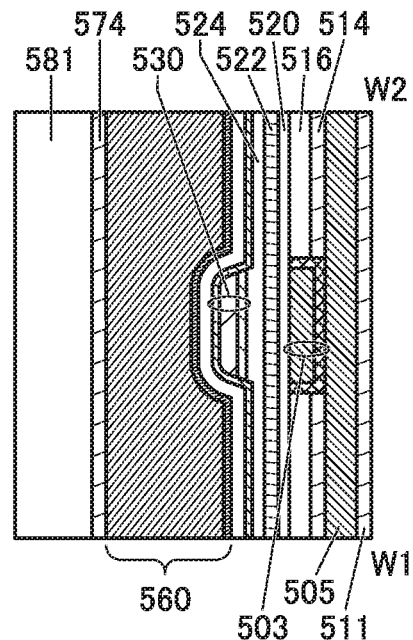
Figure 20B:
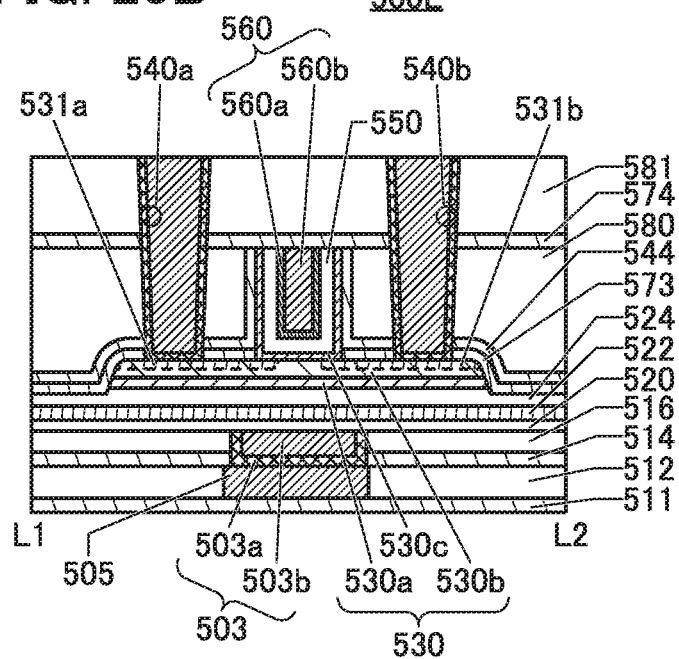

A structure example of a transistor 500E is described with reference to FIG. 20(A) to FIG. 20(C). FIG. 20(A) is a top view of the transistor 500E. FIG. 20(B) is a cross-sectional view of a portion indicated by a dashed-dotted line L1-L2 in FIG. 20(A). FIG. 20(C) is a cross-sectional view of a portion indicated by a dashed-dotted line W1-W2 in FIG. 20(A). For clarity of the drawing, some components are not shown in the top view of FIG. 20(A).

The transistor 500E has a structure different from those of the transistor 500A, the transistor 500B, the transistor 500C, and the transistor 500D. Therefore, to avoid repetition of the description, overlapping contents with the transistor 500A, the transistor 500B, the transistor 500C, and the transistor 500D are omitted and different points are mainly described.

In FIGS. 20(A), 20(B), and 20(C), the conductor 542a and the conductor 542b are not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 544.

The region 531a and the region 531b shown in FIG. 20(B) are regions where an element described below is added to the oxide 530b. The region 531a and the region 531b can be formed with the use of a dummy gate, for example.

Specifically, a dummy gate is provided over the oxide 530b, and the element that reduces the resistance of part of the oxide 530b is added using the dummy gate as a mask. That is, the element is added to regions of the oxide 530a and the oxide 530b that are not overlapped by the dummy gate, whereby the region 531a and the region 531b are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of part of the oxide 530b are boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. The concentration of the element is measured by secondary ion mass spectrometry (SIMS) or the like.

In particular, boron and phosphorus can be added by an apparatus in the manufacturing line for a Si transistor containing amorphous silicon, low-temperature polysilicon, or the like in its semiconductor layer; thus, the resistance of part of the oxide 530b can be reduced by using the apparatus in the manufacturing line. That is, part of the manufacturing line for a Si transistor can be used in the process of manufacturing the transistor 500E.

Next, an insulating film to be the insulator 573 and an insulating film to be the insulator 544 may be formed over the oxide 530b and the dummy gate. Stacking the insulating film to be the insulator 573 and the insulating film to be the insulator 544 can provide a region where the region 531a or the region 531b, the oxide 530c, and the insulator 550 overlap with each other.

Specifically, after an insulating film to be the insulator 580 is provided over the insulating film to be the insulator 544, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 544 and the insulator 573 are exposed at a side surface of an opening provided in the insulator 580, and the region 531a and the region 531b provided in the oxide 530b are partly exposed at the bottom surface of the opening. Next, an oxide film to be the oxide 530c, an insulating film to be the insulator 550, and a conductive film to be the conductor 560 are deposited sequentially in the opening, and then, the oxide film to be the oxide 530c, the insulating film to be the insulator 550, and the conductive film to be the conductor 560 are partly removed by CMP treatment or the like until the insulator 580 is exposed; thus, the transistor shown in FIGS. 20(A), 20(B), and 20(C) can be formed.

Note that the insulator 573 and the insulator 544 are not essential components. Design is appropriately set in consideration of required transistor characteristics.

Since the transistor shown in FIGS. 20(A), 20(B), and 20(C) is not provided with the conductor 542a and the conductor 542b, cost for manufacturing the transistor can be reduced.

<Transistor Structure Example 6>

Although FIGS. 15(A) and 15(B) show a structure example in which the conductor 560 that functions as a gate is formed in an opening of the insulator 580, a structure in which the insulator is provided above the conductor can be employed, for example. FIGS. 21(A) and 21(B) and FIGS. 22(A) and 22(B) show a structure example of such a transistor.

Figure 21A:
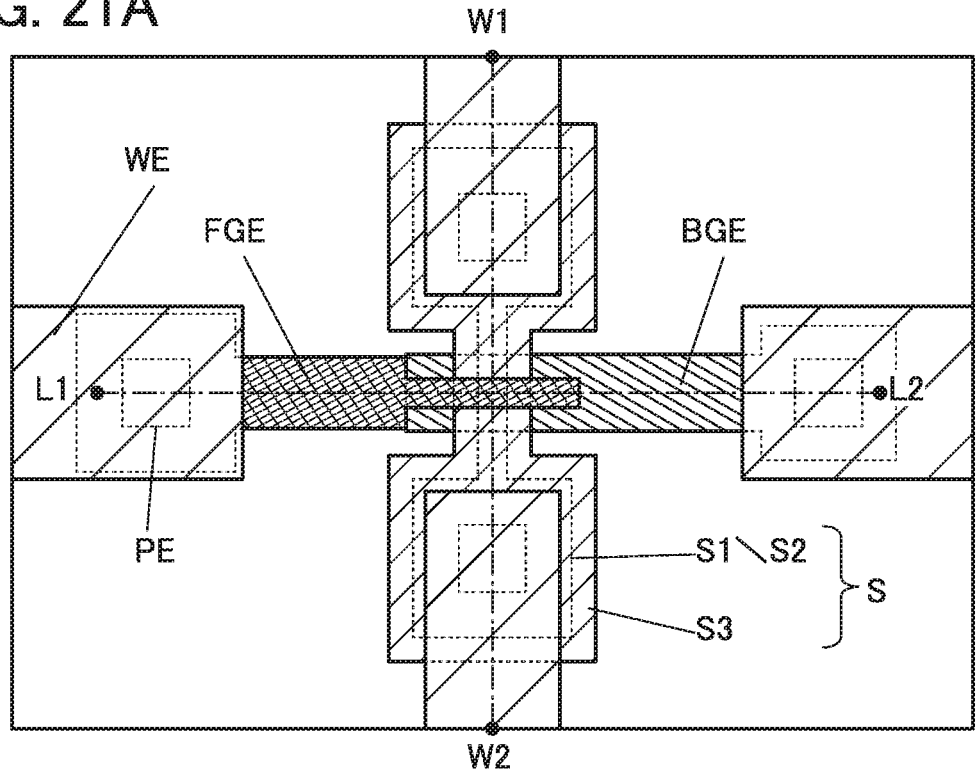
FIG. 21(A) is a top view showing a structure example of a transistor and FIG. 21(B) is a perspective view showing the structure example of the transistor.
Figure 21B:
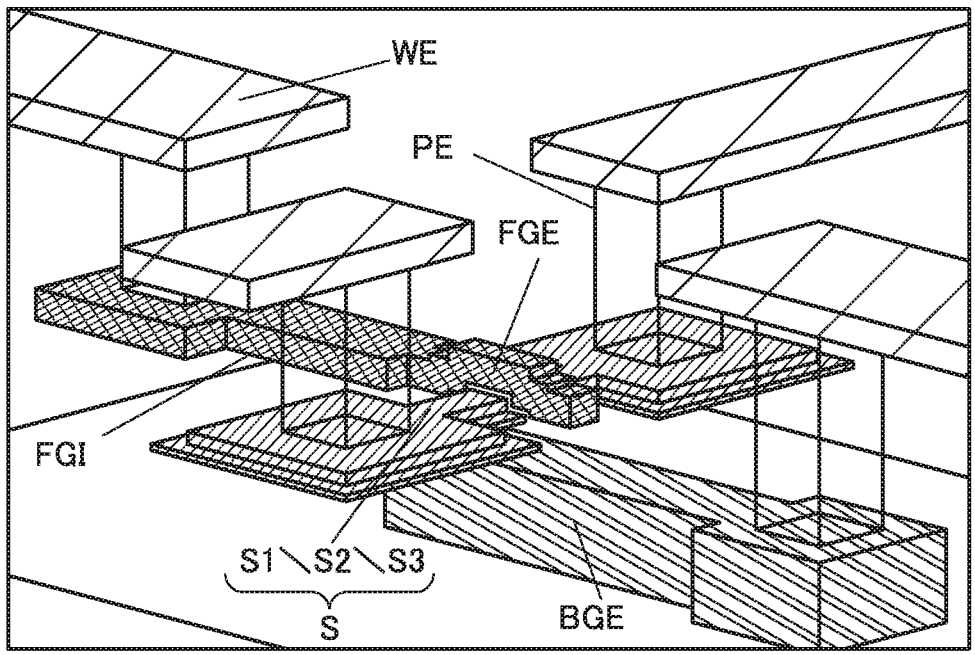
Figure 22A:
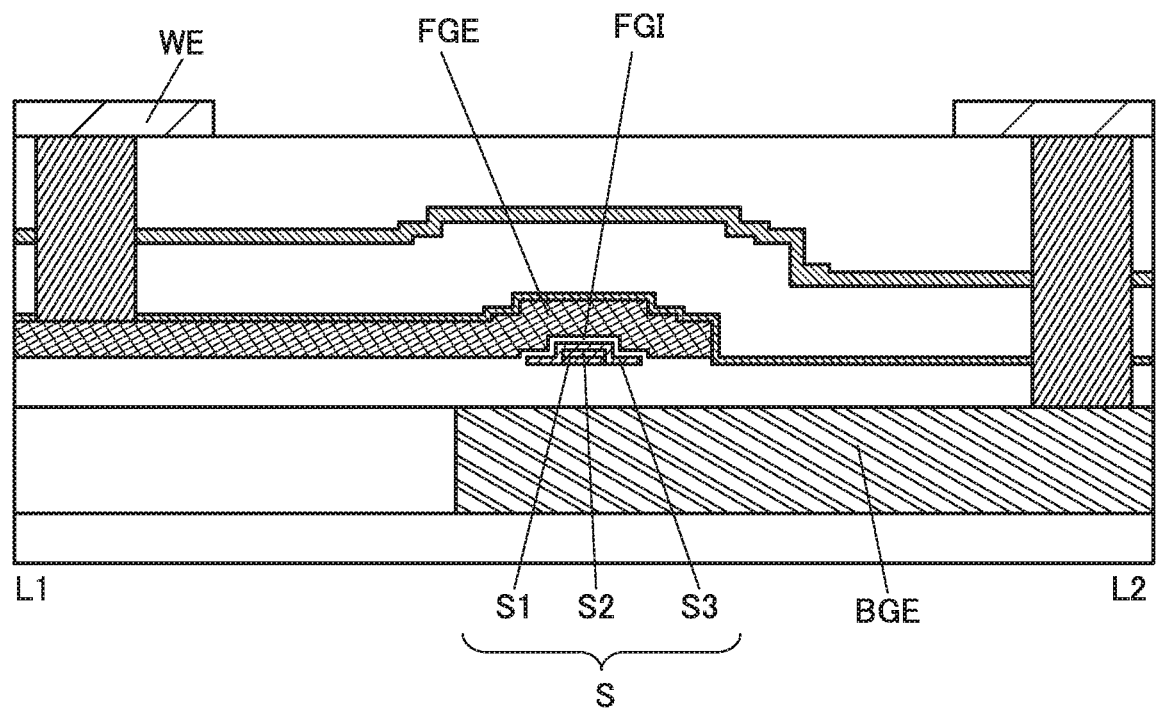
FIGS. 22(A) and 22(B) are cross-sectional views showing a structure example of a transistor.
Figure 22B:
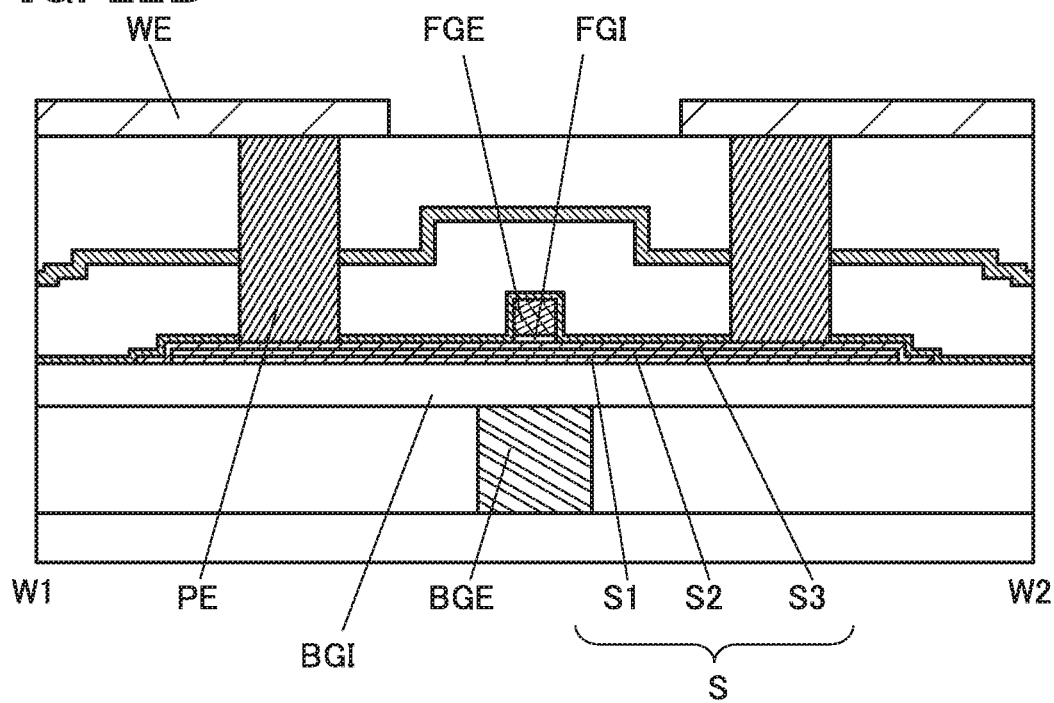

FIG. 21(A) is a top view of a transistor and FIG. 21(B) is a perspective view of the transistor. FIG. 22(A) is a cross-sectional view taken along L1-L2 in FIG. 21(A), and FIG. 22(B) is a cross-sectional view taken along W1-W2 in FIG. 21(A).

The transistor shown in FIGS. 21(A) and 21(B) and FIGS. 22(A) and 22(B) includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide S, the conductor BGE, or the conductor FGE. Note that an example in which the oxide semiconductor S includes three layers of oxides S1, S2, and S3 is shown here.

Note that this embodiment can be combined with other embodiments in this specification as appropriate.

Embodiment 4

In this embodiment, the compositions of a CAC-OS (Cloud-Aligned Composite Oxide Semiconductor) and a CAAC-OS (c-axis-Aligned Crystalline Oxide Semiconductor) which are metal oxides that can be used in the OS transistor described in the above embodiment is described. Note that in the specification and the like, the CAC refers to an example of a function or a material composition, and the CAAC refers to an example of a crystal structure.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or the CAC-metal oxide is used in a channel region of a transistor, high current drive capability in the on state of the transistor, that is, a high on-state current and high field-effect mobility, can be obtained.

In other words, the CAC-OS or the CAC-metal oxide can also be referred to as a matrix composite or a metal matrix composite.

<Structure of Metal Oxide>

Oxide semiconductors are classified into a single-crystal oxide semiconductor and a non-single-crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has a distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

Note that when the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8 \times 10^{11}/cm^{-3}$, preferably lower than $1 \times 10^{11}/cm^{-3}$, further preferably lower than $1 \times 10^{10}/cm^{-3}$, and greater than or equal to $1 \times 10^{-9}/cm^{-3}$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize the electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/$cm^3$, preferably lower than or equal to $2 \times 10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with other embodiments in this specification as appropriate.

Embodiment 5

In this embodiment, examples of products in which the semiconductor device or the electronic component described in the above embodiments is used for electronic devices are described.

<Laptop Personal Computer>

Figure 23A:
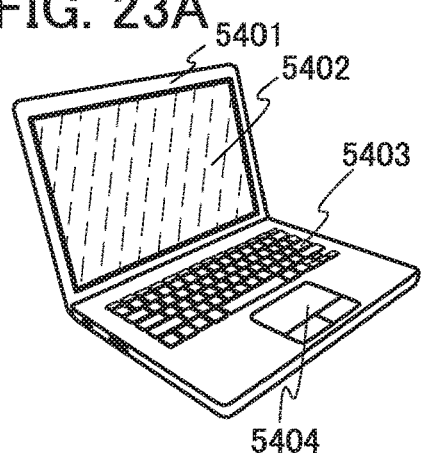
FIGS. 23(A), 23(B), 23(C), 23(D), 23(E), 23(F), 23(G), and 23(H) are perspective views showing examples of electronic devices.

The semiconductor device or the electronic component of one embodiment of the present invention can be used for a display provided in an information terminal device. FIG. 23(A) is a laptop personal computer, which is an information terminal device, and includes a housing 5401, a display portion 5402, a keyboard 5403, a pointing device 5404, and the like.

<Smartwatch>

Figure 23B:
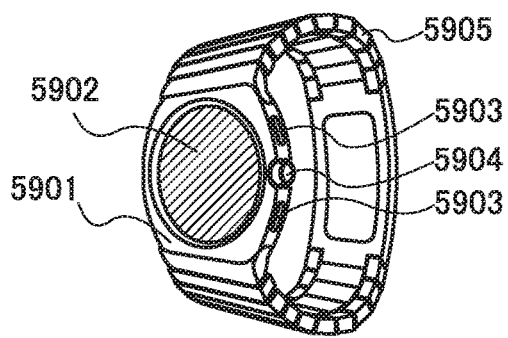

The semiconductor device or the electronic component of one embodiment of the present invention can be used for a wearable terminal. FIG. 23(B) is a smartwatch, which is a wearable terminal, and includes a housing 5901, a display portion 5902, an operation button 5903, an operator 5904, a band 5905, and the like. In addition, a display device with a function of a position input device may be used for the display portion 5902. In addition, the function of the position input device can be added by provision of a touch panel in a display device. Alternatively, the function of the position input device can be added by provision of a photoelectric conversion element called a photosensor in a pixel portion of a display device. In addition, as the operation buttons 5903, any of a power switch for activating the smartwatch, a button for operating an application of the smartwatch, a volume control button, a switch for turning on or off the display portion 5902, and the like can be provided. In addition, although the number of the operation buttons 5903 is two in the smartwatch shown in FIG. 23(B), the number of the operational buttons of the smartwatch is not limited thereto. In addition, the operator 5904 functions as a crown used for setting the time on the smartwatch. In addition, the operator 5904 may be used as an input interface for operating an application of the smartwatch as well as the crown for time adjustment. Note that although the smartwatch shown in FIG. 23(B) has a structure with the operator 5904, without being limited thereto, a structure without the operator 5904 may be used.

<Video Camera>

Figure 23C:
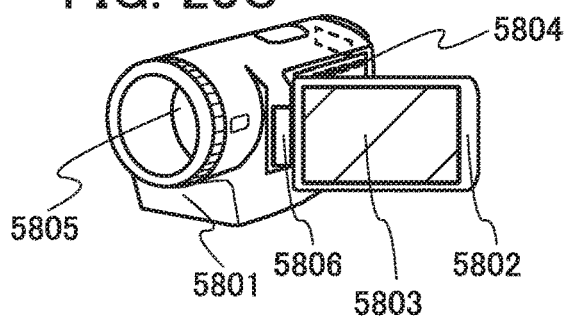

The semiconductor device or the electronic component of one embodiment of the present invention can be used for a video camera. The video camera in FIG. 23(C) includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. Furthermore, the first housing 5801 and the second housing 5802 are connected to each other with the joint portion 5806, and the angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Mobile Phone>

Figure 23D:
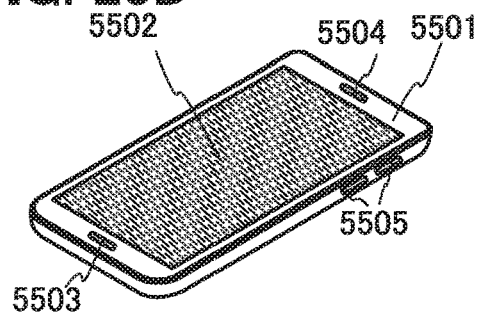

The semiconductor device or the electronic component of one embodiment of the present invention can be used for a mobile phone. FIG. 23(D) is a mobile phone having a function of an information terminal, which includes a housing 5501, a display portion 5502, a microphone 5503, a speaker 5504, and an operation button 5505. A display device with a function of a position input device may be used for the display portion 5502. In addition, the function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the mobile phone, a button for operating an application of the mobile phone, a volume control button, a switch for turning on or off the display portion 5502, and the like can be provided.

Although the mobile phone in FIG. 23(D) includes two operation buttons 5505, the number of the operation buttons included in the mobile phone is not limited thereto. Although not shown, the mobile phone shown in FIG. 23(D) may include a light-emitting device for use as a flash light or a lighting device.

<Stationary Gaming Machine>

Figure 23E:
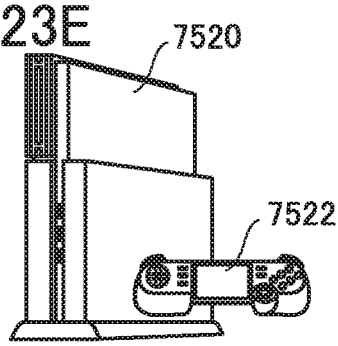

The semiconductor device of one embodiment of the present invention can be applied to a stationary gaming machine, which is an example of a gaming machine. FIG. 23(E) shows a gaming console 7520 and a controller 7522 as a gaming machine. The controller 7522 can be connected to the gaming console 7520 with or without a wire. Although not shown in FIG. 23(E), the controller 7522 can include a display portion that displays a game image, and an input interface besides a button, such as a touch panel, a stick, a rotating knob, and a sliding knob, for example. The shape of the controller 7522 is not limited to that in FIG. 23(E) and may be changed variously in accordance with the genres of games. For example, for a shooting game such as an FPS (First Person Shooter) game, a gun-shaped controller having a trigger button can be used. As another example, for a music game or the like, a controller having a shape of a musical instrument, an audio equipment, or the like can be used. Furthermore, the stationary gaming machine may include a camera, a depth sensor, a microphone, and the like so that the game player can play a game using a gesture and/or a voice instead of a controller.

<Portable Gaming Machine>

Figure 23F:
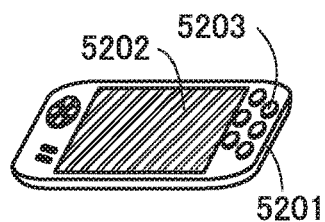

The semiconductor device of one embodiment of the present invention can be applied to a portable gaming machine, which is an example of a gaming machine. The portable gaming machine shown in FIG. 23(F) includes a housing 5201, a display portion 5202, a button 5203, and the like. Note that the portable gaming machine shown in FIG. 23(F) is an example, and the arrangement, shape, and number of the display portions, buttons, and the like of the portable gaming machine to which one embodiment of the present invention is applied are not limited to those in the structure shown in FIG. 23(F). The shape of the housing of the portable gaming machine is not limited to that in the structure shown in FIG. 23(F).

Although the above shows a stationary gaming machine, a portable gaming machine, and the like as examples of gaming machines, the semiconductor device of one embodiment of the present invention can be applied to arcade gaming machines and the like besides the above described ones.

<Television Device>

Figure 23G:
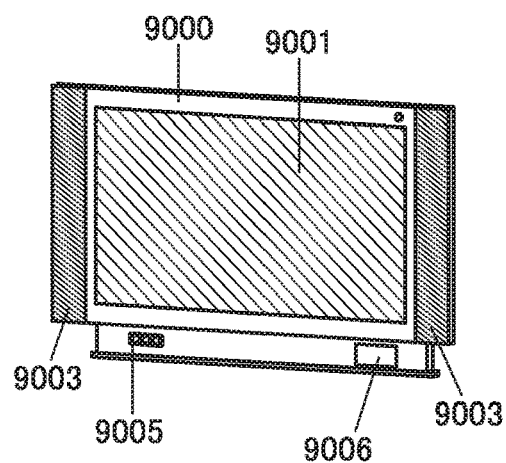

The semiconductor device or the electronic component of one embodiment of the present invention can be provided in a television device. A television device shown in FIG. 23(G) includes a housing 9000, a display portion 9001, a speaker 9003, an operation key 9005 (including a power switch or an operation switch), a connection terminal 9006, and the like. The television device can include the display portion 9001 having a large screen size of, for example, 50 inches or more, or 100 inches or more.

<Vehicle>

The semiconductor device or the electronic component of one embodiment of the present invention can be used around a driver's seat in a car, which is a vehicle.

Figure 23H:
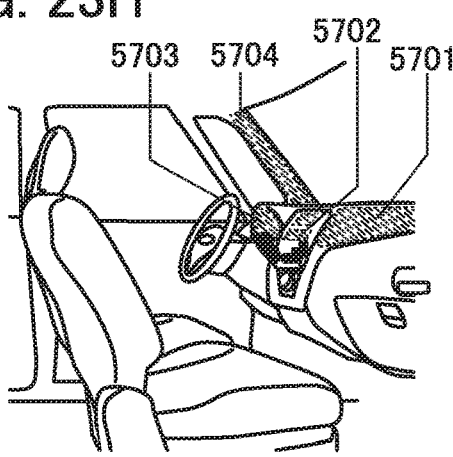

FIG. 23(H) is a figure that shows a windshield and its vicinity inside an automobile, for example. FIG. 23(H) shows a display panel 5701, a display panel 5702, and a display panel 5703 that are attached to a dashboard and a display panel 5704 that is attached to a pillar.

The display panel 5701 to the display panel 5703 can display a variety of information such as navigation information, a speedometer, a tachometer, a mileage, a fuel meter, a gearshift state, and air-conditioner settings. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (blind areas) by showing an image taken by an imaging unit provided for the car body. That is, showing an image taken by an imaging unit provided on the outside of the car body leads to elimination of blind areas and enhancement of safety. In addition, showing an image for compensating for the area which a driver cannot see makes it possible for the driver to confirm safety more easily and comfortably. The display panel 5704 can also be used as a lighting device.

<Electronic Device for Electronic Advertisement>

Figure 24A:
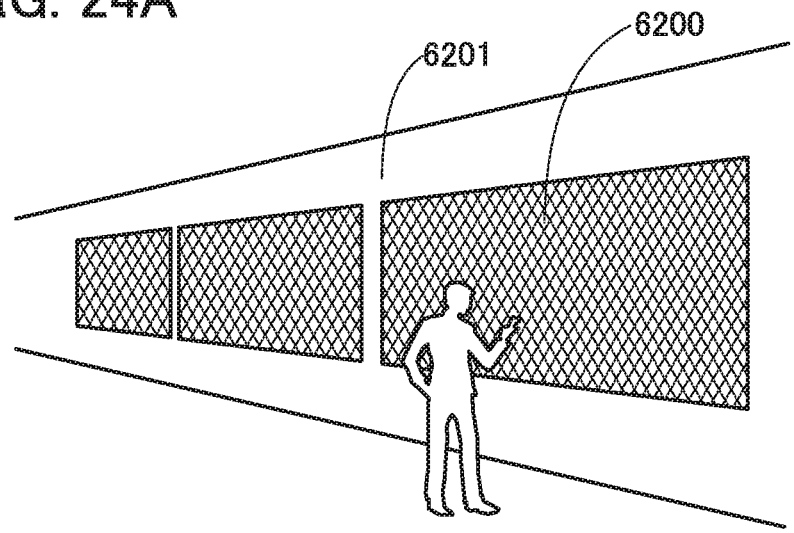
FIGS. 24(A) and 24(B) are perspective views showing examples of electronic devices.

The semiconductor device or the display device of one embodiment of the present invention can be used for a display used for an electronic advertisement. FIG. 24(A) shows an example of digital signage that can be attached to a wall. FIG. 24(A) shows how a digital signage 6200 is attached to a wall 6201.

<Foldable Tablet Information Terminal>

Figure 24B:
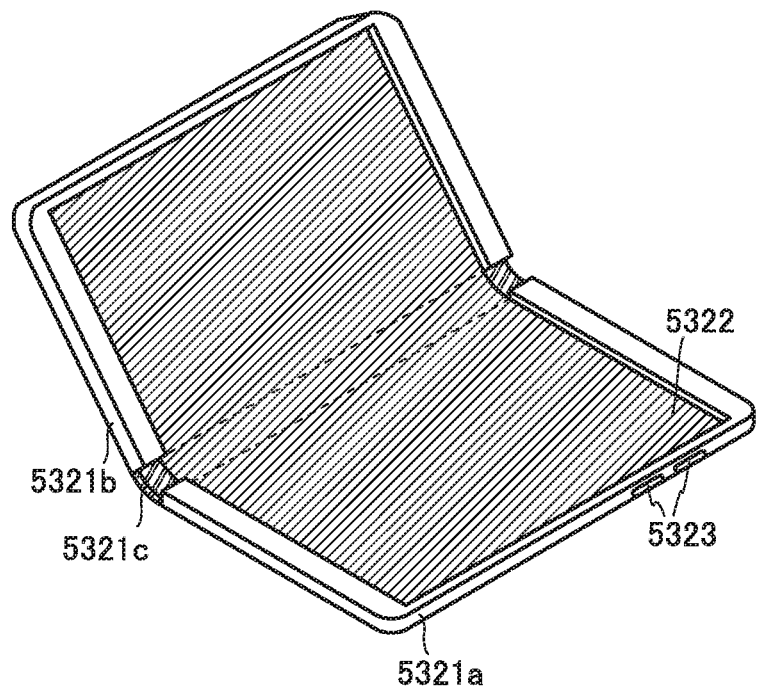

The semiconductor device or the display device of one embodiment of the present invention can be used for a tablet information terminal. FIG. 24(B) shows a tablet information terminal with a structure that can be folded. The information terminal in FIG. 24(B) includes a housing 5321*a*, a housing 5321*b*, a display portion 5322, and an operation button 5323. In particular, the display portion 5322 includes a flexible base, and the base enables a structure that can be folded.

The housing 5321*a* and the housing 5321*b* are connected to each other with a hinge portion 5321*c* that allows a bi-fold. In addition, the display portion 5322 is provided to the housing 5321*a*, the housing 5321*b*, and the hinge portion 5321*c*.

Although not shown, the electronic devices shown in FIGS. 23(A) to 23(C) and 23(E), and FIGS. 24(A) and 24(B) can each have a structure that includes a microphone and a speaker. With this structure, the above electronic devices can have an audio input function, for example.

In addition, although not shown, each of the electronic devices shown in FIGS. 23(A), 23(B), and 23(D), and FIGS. 24(A), and 24(B) may have a structure that includes a camera.

In addition, the electronic devices illustrated in FIGS. 23(A) to 23(G) and FIGS. 24(A) and 24(B) may have, although not shown, a structure provided with a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) in the housing. In particular, by providing a detection device including a sensor for detecting tilt, such as a gyroscope sensor or an acceleration sensor, for the mobile phone shown in FIG. 23(D), the direction of the mobile phone (which direction the mobile phone faces in, with respect to the vertical direction) is determined, so that display on the display portion 5502 can be automatically changed in accordance with the direction of the mobile phone.

In addition, although not illustrated, the electronic devices illustrated in FIGS. 23(A) to 23(G) and FIGS. 24(A) and 24(B) may have a structure that includes a device for obtaining biological information such as fingerprints, veins, iris, or voice prints. Employing this structure can achieve an electronic device having a biometric identification function.

Furthermore, as a display portion of the electronic devices shown in FIGS. 23(A) to 23(G) and FIG. 24(A), a flexible base may be used. Specifically, the display portion may have a structure in which a transistor, a capacitor, a display element, and the like are provided over a flexible base. With such a structure, in addition to the electronic device having the housing with a flat surface as shown in FIGS. 23(A) to 23(G) and FIG. 24(A), an electronic device having a housing with a curved surface like the dashboard and the pillar shown in FIG. 23(H) can be enabled.

As a flexible base that can be used for the display portions in FIGS. 23(A) to 23(G) and FIGS. 24(A) and 24(B), any of the following materials that transmit visible light can be used: a poly(ethylene terephthalate) resin (PET), a poly (ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, and the like. Alternatively, a mixture or a stack including any of these materials may be used.

Note that this embodiment can be combined with other embodiments in this specification as appropriate.

REFERENCE NUMERALS

M1: transistor, M2: transistor, M3: transistor, CA: capacitor, CB: capacitor, CF: capacitor, BIL: wiring, RBL: wiring, WBL: wiring, WOL: wiring, SL: wiring, CAL: wiring, BGL: wiring, BGL1: wiring, BGL2: wiring, BGI: insulator, FGI: insulator, BGE: conductor, FGE: conductor, PE: conductor, WE: conductor, 11: semiconductor device, 20: control circuit, 21: control unit, 22[1]: voltage generation circuit, 22[P]: voltage generation circuit, 22[p1]: voltage generation circuit, 22[p2]: voltage generation circuit, 22[p3]: voltage generation circuit, 23A: circuit, 23B: circuit, 23IN: internal circuit, 25: temperature sensing circuit, 25$a$: temperature sensor, 25$b$: analog-to-digital converter circuit, 25$c$: voltage control circuit, 30: memory unit, 40: memory cell array, 50: peripheral circuit, 51: word line driver circuit, 52: bit line driver circuit, 52$a$: column decoder, 52$b$: precharge circuit, 52$c$: sense amplifier, 52$d$: write circuit, 53: row decoder, 54: output circuit, 56: control logic circuit, 110: first memory region, 120: second memory region, 121: cache, 122: cache, 123: cache, 130: third memory region, 140: fourth memory region, 200: memory device, 210: memory circuit, 220: memory circuit, 220$a$: memory circuit, 220$b$: memory circuit, 221: memory cell, 230: memory circuit, 230$a$: memory circuit, 230$b$: memory circuit, 231: memory cell, 232: memory cell, 240: memory circuit, 300: transistor, 311: substrate, 313: semiconductor region, 314$a$: low-resistance region, 314$b$: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 500A: transistor, 500B: transistor, 500C: transistor, 500D: transistor, 500E: transistor, 503: conductor, 503$a$: conductor, 503$b$: conductor, 505: conductor, 510: insulator, 511: insulator, 512: insulator, 514: insulator, 516: insulator, 518: conductor, 520: insulator, 522: insulator, 524: insulator, 530: oxide, 530$a$: oxide, 530$b$: oxide, 530$c$: oxide, 531$a$: region, 531$b$: region, 540$a$: conductor, 540$b$: conductor, 542$a$: conductor, 542$b$: conductor, 543$a$: region, 543$b$: region, 544: insulator, 545: insulator, 546: conductor, 546$a$: conductor, 546$b$: conductor, 547$a$: conductor, 547$b$: conductor, 548: conductor, 550: insulator, 552: metal oxide, 560: conductor, 560$a$: conductor, 560$b$: conductor, 570: insulator, 571: insulator, 573: insulator, 574: insulator, 575: insulator, 576$a$: insulator, 576$b$: insulator, 580: insulator, 581: insulator, 582: insulator, 586: insulator, 600: capacitor, 610: conductor, 612: conductor, 620: conductor, 630: insulator, 650: insulator, 5201: housing, 5202: display portion, 5203: button, 5321$a$: housing, 5321$b$: housing, 5321$c$: hinge portion, 5322: display portion, 5323: operation button, 5401: housing, 5402: display portion, 5403: keyboard, 5404: pointing device, 5501: housing, 5502: display portion, 5503: microphone, 5504: speaker, 5505: operation button, 5701: display panel, 5702: display panel, 5703: display panel, 5704: display panel, 5801: first housing, 5802: second housing, 5803: display portion, 5804: operation key, 5805: lens, 5806: joint portion, 5901: housing, 5902: display portion, 5903: operation button, 5904: operator, 5905: band, 6200: digital signage, 6201: wall, 7520: gaming machine, 7522: controller, 9000: housing, 9001: display portion, 9003: speaker, 9005: operation key, 9006: connection terminal

The invention claimed is:

1. A semiconductor device comprising:
a memory device and a control circuit,
wherein the memory device comprises a first memory circuit operating in a first memory level and a second memory circuit operating in a second memory level,
wherein the first memory level is a level with a higher access speed than the second memory level,
wherein the first memory circuit comprises a first capacitor and a first transistor configured to hold charges held in the first capacitor,
wherein the second memory circuit comprises a second transistor, a second capacitor electrically connected to a gate of the second transistor, and a third transistor configured to hold charges held in the second capacitor,
wherein the first transistor and the third transistor each comprise a semiconductor layer including an oxide semiconductor, a first gate, and a second gate, and
wherein the control circuit is configured to input a first voltage to the second gate of the first transistor in part of the first memory circuit so that the part of the first memory circuit operates in the second memory level, and
wherein the control circuit is configured to input a second voltage to the second gate of the third transistor in part of the second memory circuit so that the part of the second memory circuit operates in the first memory level.

2. The semiconductor device according to claim 1, wherein the control circuit comprises a temperature sensing circuit,
wherein the temperature sensing circuit is configured to output a correction voltage depending on a temperature around the memory device, and
wherein the control circuit is configured to change a voltage applied to the second gate of each of the first transistor and the third transistor depending on the correction voltage.

3. The semiconductor device according to claim 1, wherein the oxide semiconductor comprises one or more materials selected from indium, an element M, and zinc, and
wherein the element M is one of aluminum, gallium, yttrium, and tin.

4. A semiconductor device comprising:
a memory device and a control circuit,
wherein the memory device comprises a first memory circuit operating in a first memory level and a second memory circuit operating in a second memory level,
wherein the first memory level is a level with a higher access speed than the second memory level,
wherein the first memory circuit comprises a first capacitor and a first transistor configured to hold charges held in the first capacitor,
wherein the second memory circuit comprises a second transistor, a second capacitor electrically connected to a gate of the second transistor, and a third transistor configured to hold charges held in the second capacitor,
wherein the first transistor and the third transistor each comprise a semiconductor layer including an oxide semiconductor, a first gate, and a second gate,
wherein the control circuit is configured to input a first voltage to the second gate of the first transistor in part of the first memory circuit so that the part of the first memory circuit is changed from the first memory level to the second memory level, wherein the control circuit is configured to input a second voltage to the second gate of the third transistor in part of the second memory circuit so that the part of the second memory circuit is changed from the second memory level to the first memory level, wherein the control circuit comprises a controller, a plurality of voltage generation circuits, and a switching circuit, wherein the memory device is configured to output a signal of using status of a memory capacity of the memory device to the controller, and wherein the controller is configured to control the switching circuit so that a voltage output from any one of the plurality of the voltage generation circuits is applied to the second gates of the first transistor and the third transistor in response to the signal.

5. The semiconductor device according to claim 4, wherein the control circuit comprises a temperature sensing circuit, wherein the temperature sensing circuit is configured to output a correction voltage depending on a temperature around the memory device, and wherein the control circuit is configured to change a voltage applied to the second gate of each of the first transistor and the third transistor depending on the correction voltage.

6. The semiconductor device according to claim 4, wherein the oxide semiconductor comprises one or more materials selected from indium, an element M, and zinc, and wherein the element M is one of aluminum, gallium, yttrium, and tin.

7. The semiconductor device according to claim 4, wherein the first memory circuit comprises a region overlapping with the second memory circuit.

8. The semiconductor device according to claim 7, wherein the control circuit comprises a temperature sensing circuit, wherein the temperature sensing circuit is configured to output a correction voltage depending on a temperature around the memory device, and wherein the control circuit is configured to change a voltage applied to the second gate of each of the first transistor and the third transistor depending on the correction voltage.

9. The semiconductor device according to claim 7, wherein the oxide semiconductor comprises one or more materials selected from indium, an element M, and zinc, and wherein the element M is one of aluminum, gallium, yttrium, and tin.

10. The semiconductor device according to claim 1, wherein the first memory circuit comprises a region overlapping with the second memory circuit.

11. A semiconductor device comprising:

a memory device and a control circuit, wherein the memory device comprises a first memory circuit operating in a first memory level and a second memory circuit operating in a second memory level, wherein the first memory level is a level with a higher access speed than the second memory level, wherein the first memory circuit comprises a plurality of first memory cells each comprising a first capacitor and a first transistor configured to hold charges held in the first capacitor, wherein the second memory circuit comprises a plurality of second memory cells each comprising a second transistor, a second capacitor electrically connected to a gate of the second transistor, and a third transistor configured to hold charges held in the second capacitor, wherein the first transistor and the third transistor each comprise a semiconductor layer including an oxide semiconductor, a first gate, and a second gate, wherein part of the first memory circuit is able to operate in the second memory level when a first voltage is input to the second gate of the first transistor of at least one first memory cell in the part of the first memory circuit, and wherein part of the second memory circuit is able to operate in the first memory level when a second voltage is input to the second gate of the third transistor of at least one second memory cell in the part of the second memory circuit.

12. The semiconductor device according to claim 11, wherein the control circuit comprises a temperature sensing circuit, wherein the temperature sensing circuit is configured to output a correction voltage depending on a temperature around the memory device, and wherein the control circuit is configured to change voltages applied to the second gates of the first transistors in the plurality of plurality of first memory cells and the second gates of the third transistors in the plurality of plurality of second memory cells depending on the correction voltage.

13. The semiconductor device according to claim 11, wherein the oxide semiconductor comprises one or more materials selected from indium, an element M, and zinc, and wherein the element M is one of aluminum, gallium, yttrium, and tin.

14. The semiconductor device according to claim 11, wherein the first memory circuit comprises a region overlapping with the second memory circuit.

* * * * *